US012588221B2

(12) United States Patent
Song

(10) Patent No.: US 12,588,221 B2
(45) Date of Patent: Mar. 24, 2026

(54) THREE-DIMENSIONAL FLASH MEMORY WITH HIGH DEGREE OF INTEGRATION

(71) Applicant: IUCF-HYU (INDUSTRY-UNIVERSITY COOPERATION FOUNDATION HANYANG UNIVERSITY), Seoul (KR)

(72) Inventor: Yun Heub Song, Seoul (KR)

(73) Assignee: IUCF-HYU (INDUSTRY-UNIVERSITY COOPERATION FOUNDATION HANYANG UNIVERISTY), Seoul (KR)

( * ) Notice: Subject to any disclaimer, the term of this patent is extended or adjusted under 35 U.S.C. 154(b) by 508 days.

(21) Appl. No.: 18/015,669

(22) PCT Filed: Jul. 2, 2021

(86) PCT No.: PCT/KR2021/008445
§ 371 (c)(1),
(2) Date: Jan. 11, 2023

(87) PCT Pub. No.: WO2022/014922
PCT Pub. Date: Jan. 20, 2022

(65) Prior Publication Data
US 2023/0255035 A1     Aug. 10, 2023

(30) Foreign Application Priority Data

| | | |
|---|---|---|
| Jul. 15, 2020 | (KR) | ........................ 10-2020-0087355 |
| Jul. 20, 2020 | (KR) | ........................ 10-2020-0089567 |
| Aug. 28, 2020 | (KR) | ........................ 10-2020-0109572 |

(51) Int. Cl.
H10B 80/00 (2023.01)
H01L 23/48 (2006.01)
H10B 43/27 (2023.01)

(52) U.S. Cl.
CPC ........... *H10B 80/00* (2023.02); *H01L 23/481* (2013.01); *H10B 43/27* (2023.02)

(58) Field of Classification Search
CPC ........ H10B 80/00; H10B 43/50; H10B 43/27; H01L 25/18; H01L 25/0657; H01L 23/481; H01L 2225/06541
See application file for complete search history.

(56) References Cited

U.S. PATENT DOCUMENTS 9,524,981 B2 * 12/2016 Pachamuthu ..... H01L 23/53271
9,876,031 B1 * 1/2018 Shimizu .............. H01L 23/5226
(Continued)

FOREIGN PATENT DOCUMENTS

CN 109075170 A * 12/2018 ......... H01L 21/4857
KR 10-2012-0019654 A 3/2012
(Continued)

OTHER PUBLICATIONS

International Search Report for PCT/KR2021/008445 dated Oct. 19, 2021.

*Primary Examiner* — Mamadou L Diallo
(74) *Attorney, Agent, or Firm* — Sughrue Mion, PLLC

(57) ABSTRACT

A through silicon via (TSV)-based three-dimensional flash memory having a high degree of integration comprises: at least one memory cell string chip including a plurality of memory cell strings; and a peripheral circuit chip including at least one peripheral circuit, wherein the peripheral circuit chip is arranged below the at least one memory cell string chip and is connected to the at least one memory cell string chip by using at least one TSV. The at least one memory cell string chip includes the plurality of memory cell strings, and (Continued)

the peripheral circuit chip is connected to the at least one peripheral circuit. The peripheral circuit chip is connected to the at least one memory cell string chip by using the at least one TSV extending through the at least one memory cell string chip.

14 Claims, 33 Drawing Sheets

(56) References Cited

U.S. PATENT DOCUMENTS

| | | | | |
|---|---|---|---|---|
| 10,354,980 B1* | 7/2019 | Mushiga | ............ | H01L 23/5226 |
| 10,854,627 B1* | 12/2020 | Moriyama | ............ | H10D 30/63 |
| 10,916,556 B1* | 2/2021 | Sakakibara | ............ | H10B 43/40 |
| 2015/0303209 A1* | 10/2015 | Park | ........................ | H10B 43/40 |
| | | | | 257/316 |
| 2016/0093637 A1* | 3/2016 | Lee | ........................ | H10B 43/27 |
| | | | | 438/269 |
| 2018/0138194 A1* | 5/2018 | Shigemura | ............. | H10B 43/35 |
| 2019/0326319 A1* | 10/2019 | Yun | ........................ | H01L 23/528 |
| 2020/0006299 A1* | 1/2020 | Liu | ........................ | H01L 25/105 |
| 2020/0098771 A1* | 3/2020 | Nishikawa | ............. | H10B 41/10 |
| 2020/0098784 A1* | 3/2020 | Nagashima | ....... | H01L 21/31116 |
| 2020/0219895 A1* | 7/2020 | Mushiga | ............. | H10D 84/016 |
| 2020/0258857 A1* | 8/2020 | Huo | ......................... | H01L 24/20 |
| 2020/0328186 A1* | 10/2020 | Liu | ........................ | H01L 25/0657 |
| 2021/0082951 A1* | 3/2021 | Toyonaga | ............. | H10B 43/40 |
| 2021/0134779 A1* | 5/2021 | Huang | .................... | H01L 24/32 |
| 2021/0247910 A1* | 8/2021 | Kim | ........................ | G06F 3/0611 |
| 2022/0020712 A1* | 1/2022 | Wang | .................... | H10B 41/50 |

FOREIGN PATENT DOCUMENTS

| | | |
|---|---|---|
| KR | 10-2015-0048553 A | 5/2015 |
| KR | 10-2017-0072607 A | 6/2017 |
| KR | 10-2018-0042358 A | 4/2018 |
| KR | 10-2018-0064734 A | 6/2018 |
| KR | 10-2018-0102727 A | 9/2018 |
| WO | 2020/014981 A1 | 1/2020 |

* cited by examiner

Figure 5:
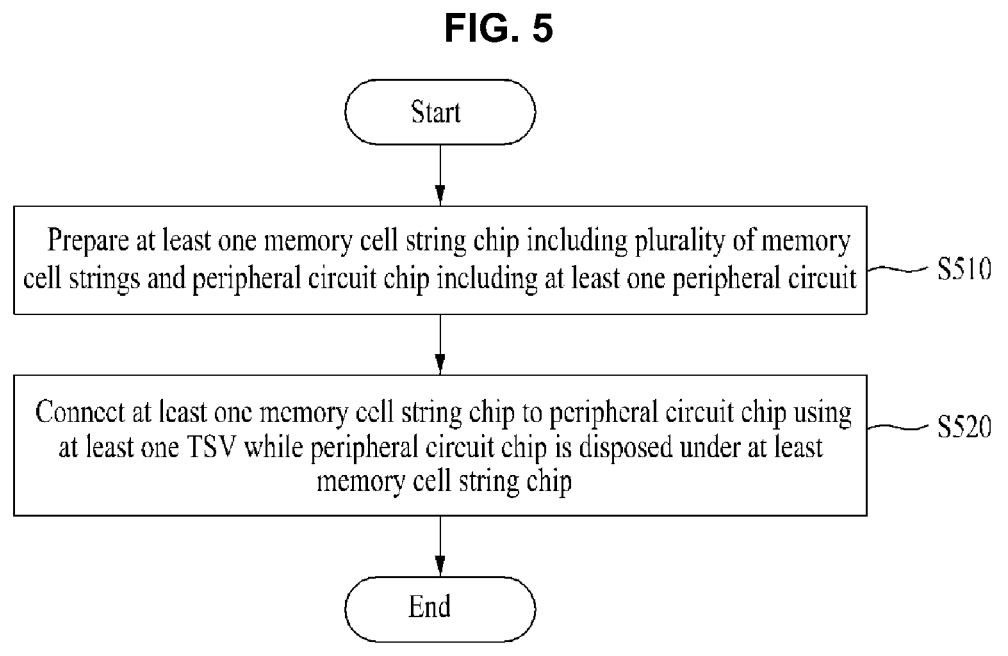

Start

Prepare at least one memory cell string chip including plurality of memory cell strings and peripheral circuit chip including at least one peripheral circuit ⸺ S510

Connect at least one memory cell string chip to peripheral circuit chip using at least one TSV while peripheral circuit chip is disposed under at least memory cell string chip ⸺ S520

End

700

FIG. 8
800
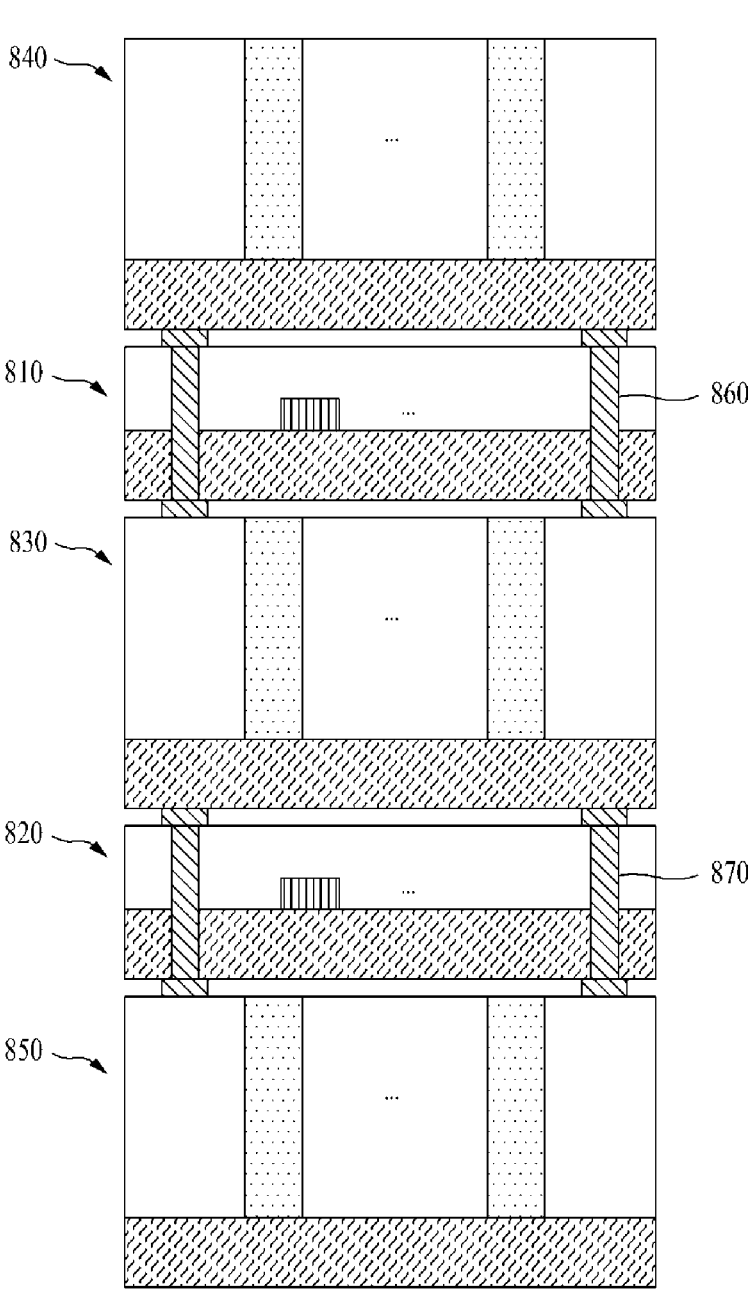
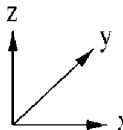

FIG. 10B

FIG. 11
1100
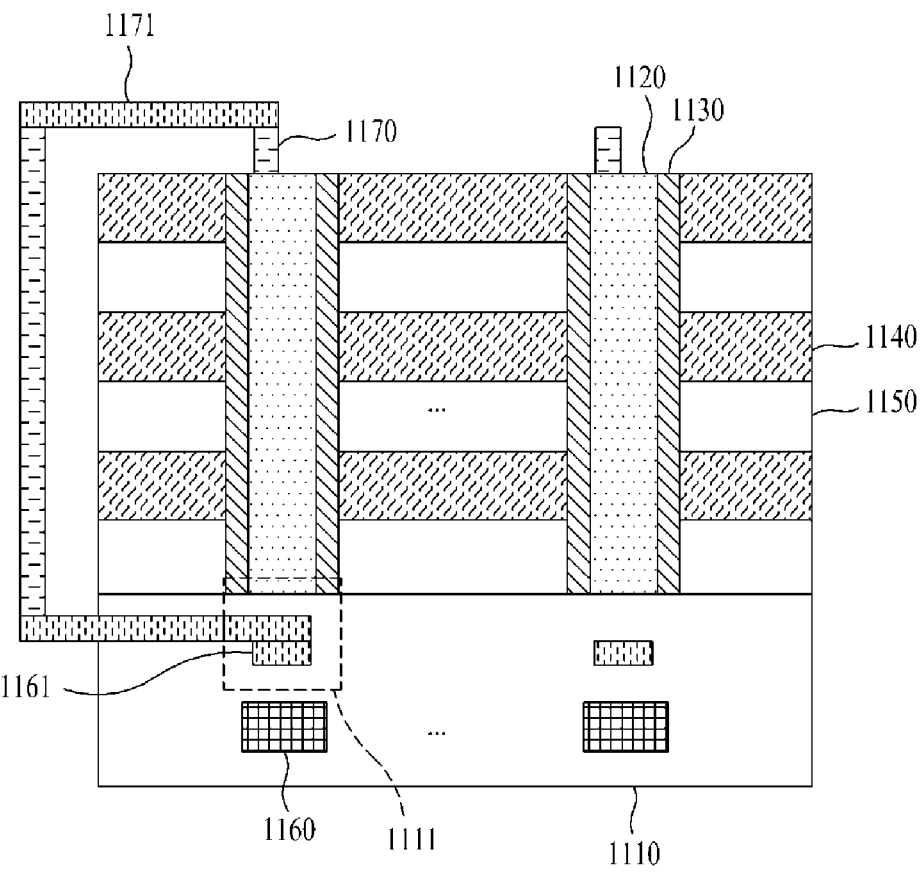
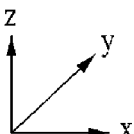

Figure 13:
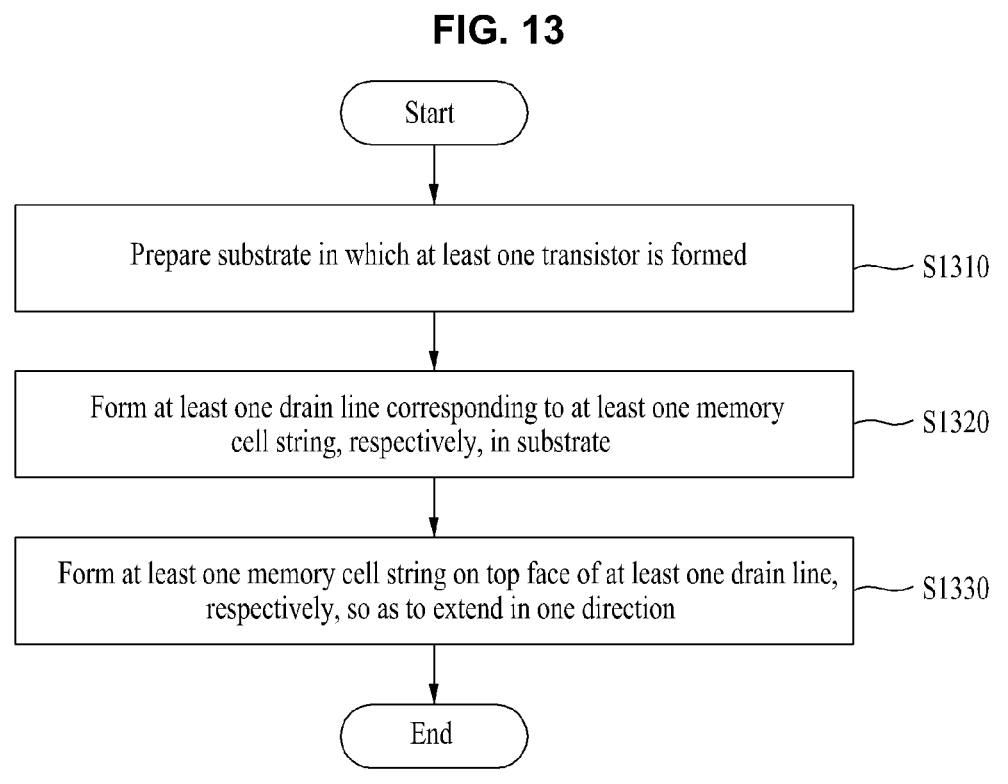

Start

Prepare substrate in which at least one transistor is formed — S1310

Form at least one drain line corresponding to at least one memory cell string, respectively, in substrate — S1320

Form at least one memory cell string on top face of at least one drain line, respectively, so as to extend in one direction — S1330

End

FIG. 14A
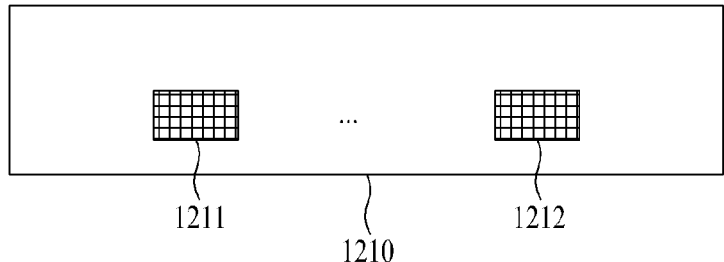
1211        1212
1210
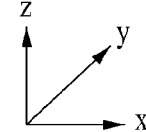

FIG. 14B
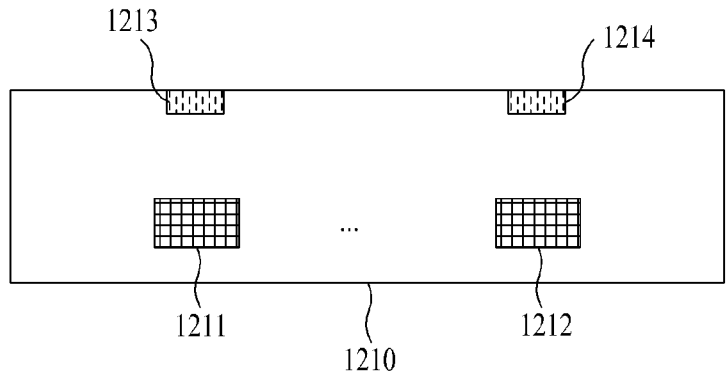
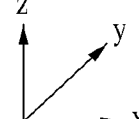

FIG. 14D
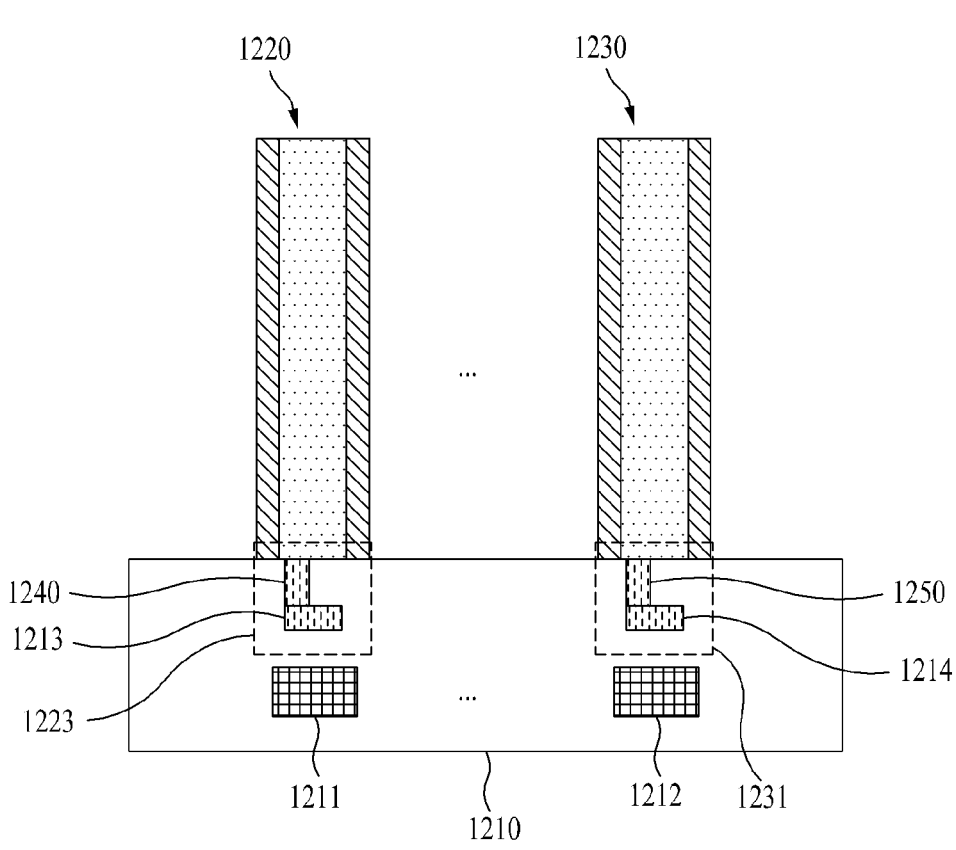
1220
1230
1240
1213
1223
1250
1214
1231
1211
1212
1210
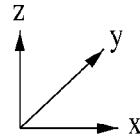

FIG. 14E
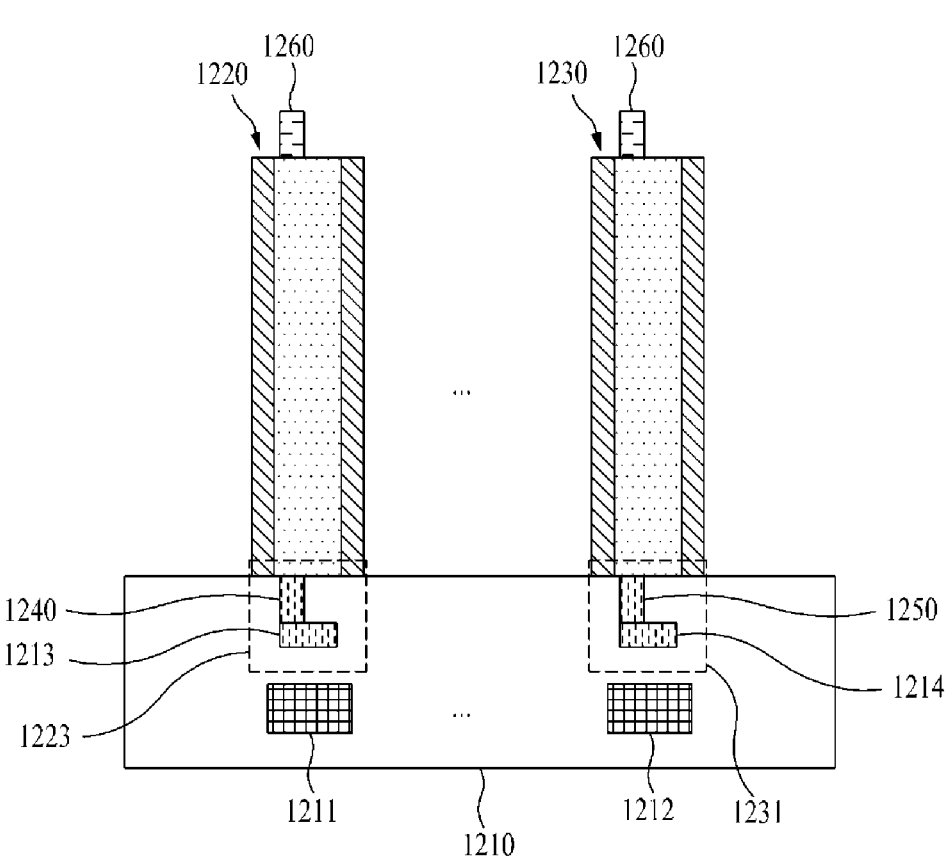
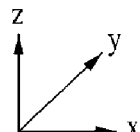

Figure 18:
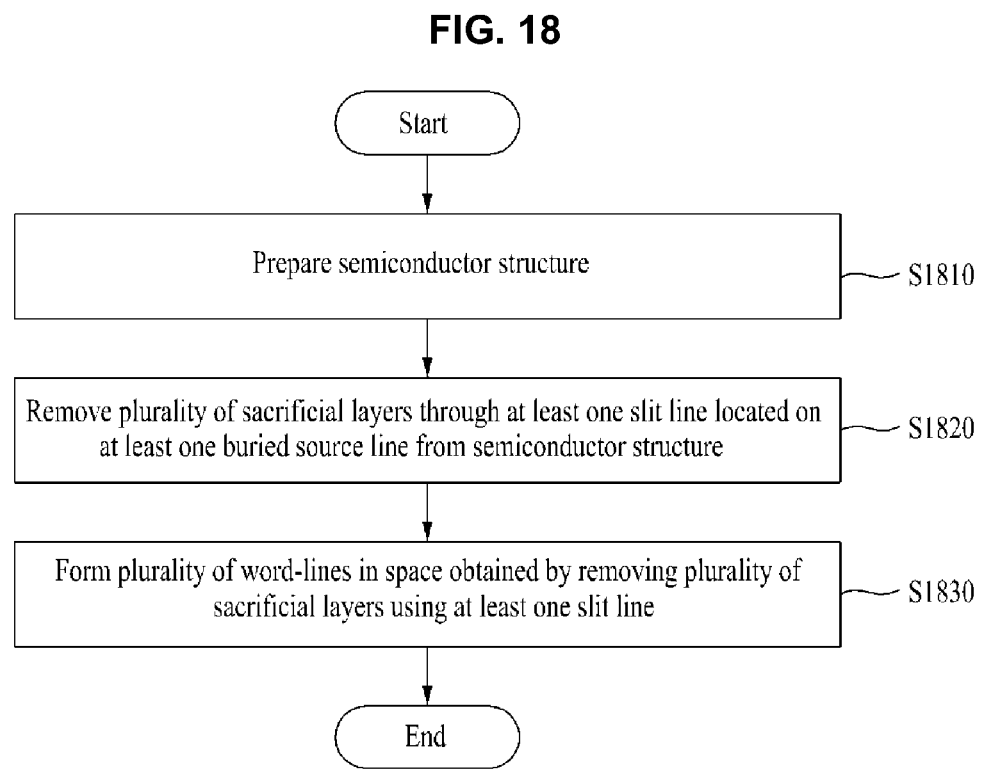

Start

Prepare semiconductor structure    S1810

Remove plurality of sacrificial layers through at least one slit line located on at least one buried source line from semiconductor structure    S1820

Form plurality of word-lines in space obtained by removing plurality of sacrificial layers using at least one slit line    S1830

End

FIG. 20

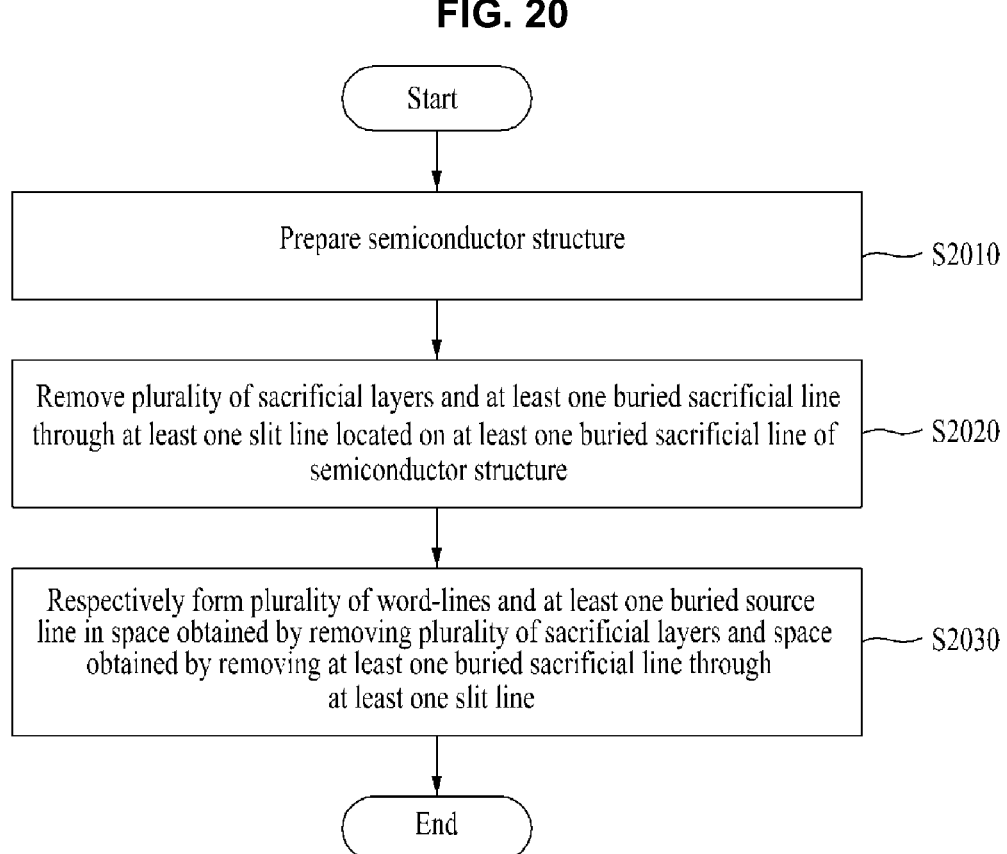

Start

Prepare semiconductor structure — S2010

Remove plurality of sacrificial layers and at least one buried sacrificial line through at least one slit line located on at least one buried sacrificial line of semiconductor structure — S2020

Respectively form plurality of word-lines and at least one buried source line in space obtained by removing plurality of sacrificial layers and space obtained by removing at least one buried sacrificial line through at least one slit line — S2030

End

THREE-DIMENSIONAL FLASH MEMORY WITH HIGH DEGREE OF INTEGRATION

This Application is a National Stage of International Application No. PCT/KR2021/008445 filed Jul. 2, 2021, claiming priority based on Korean Patent Application No. 10-2020-0087355 filed Jul. 15, 2020, Korean Patent Application No. 10-2020-0089567 filed Jul. 20, 2020, and Korean Patent Application No. 10-2020-0109572 filed Aug. 28, 2020.

TECHNICAL FIELD

Embodiments as described below relate to a three-dimensional flash memory, and more specifically, to a three-dimensional flash memory with high integration.

BACKGROUND ART

A flash memory is an electrically erasable and programmable read only memory (EEPROM), and electrically controls input/output of data via F-N (Fowler-Nordheim) tunneling or hot electron injection.

Recently, a three-dimensional structure that increases integration by increasing a length in a vertical direction of a memory cell string has been applied to a flash memory to meet excellent performance and low price required by consumers. Further, as shown in FIG. 1 showing a conventional three-dimensional flash memory, the three-dimensional flash memory includes a memory cell string chip 110 including a channel layer 112 extending in a direction perpendicular to a substrate 111, a charge storage layer 113 formed to surround the channel layer 112, a plurality of electrode layers 114 connected to the charge storage layer 113 and stacked in a vertical direction and extending in a horizontal direction, and a plurality of insulating layers 115, wherein the plurality of insulating layers 115 and the plurality of electrode layers 114 are alternately stacked with each other, and a separate peripheral circuit chip 120 including at least one peripheral circuit 121, wherein the memory cell string chip 110 and a peripheral circuit chip 120 are stacked on top of each other. Hereinafter, the charge storage layer 113, the channel layer 112, and the plurality of electrode layers 114 which are components directly related to data storage and reading may constitute a memory cell string.

However, because a conventional three-dimensional flash memory 100 has a stack structure of one memory cell string chip 110 and one peripheral circuit chip 120, the conventional three-dimensional flash memory 100 has a disadvantage that an integration density thereof is not relatively high.

Moreover, the memory cell string chip 110 of the conventional three-dimensional flash memory 100 includes not only a plurality of memory cell strings, but also at least one peripheral circuit 116 in the substrate 111. Thus, when manufacturing the memory cell string chip 110, the at least one peripheral circuit 116 should be further formed in addition to forming the plurality of memory cell strings. Thus, a manufacturing process cost is high.

Therefore, a technique for avoiding the disadvantages and problems as described in relation to the conventional three-dimensional flash memory 100 needs to be proposed.

Further, referring to FIG. 11 showing a conventional three-dimensional flash memory, a three-dimensional flash memory 1100 includes a channel layer 1120 extending in a direction perpendicular to a substrate 1110, a charge storage layer 1130 formed to surround the channel layer 1120, a plurality of electrode layers 1140 connected to the charge storage layer 1130 and stacked in a vertical direction and extending in a horizontal direction, and a plurality of insulating layers 1150, wherein the plurality of insulating layers 1150 and the plurality of electrode layers 1140 are stacked alternately with each other. Hereinafter, the charge storage layer 1130, the channel layer 1120, and plurality of electrode layers 1140 which are components directly related to data storage and reading may constitute a memory cell string.

The conventional three-dimensional flash memory 1100 may have a COP structure in which at least one transistor 1160 included in a core circuit related to data storage and reading operations of the three-dimensional flash memory 1100, or included in a peripheral circuit related to other operations except for the data storage and reading operations of the three-dimensional flash memory 1100 is formed in the substrate 1110.

In the conventional three-dimensional flash memory 1100 to which the COP structure is applied, a drain line 1170 of the memory cell string is located at a top of the memory cell string. Thus, a connection portion 1171 of the drain line 1170 to a wiring 1161 of the at least one transistor 1160 is located outside an area 1111 of the memory substrate 1110 vertically overlapping the memory cell string, resulting in poor integration.

Therefore, a technique for solving the disadvantages of the conventional three-dimensional flash memory 1100 needs to be proposed.

Further, referring to FIG. 15 showing a conventional three-dimensional flash memory, a three-dimensional flash memory 1500 includes at least one memory cell string 1520 including a channel layer 1521 extending in a perpendicular direction (in one example, a Z direction) to a substrate 1510, and a charge storage layer 1522 formed to surround the channel layer 1521, a plurality of word-lines 1530 connected to the at least one memory cell string 1520 and arranged in a vertical direction, and a common source line 1540 disposed on the substrate 1510 such that a step is defined between the source line and the substrate.

In this regard, as described above, the common source line 1540 is formed on the substrate 1510 such that the step is defined between the source line and the substrate. Thus, the conventional three-dimensional flash memory has a disadvantage that complexity of a source line manufacturing process is high and a cell integration density is lowered.

Therefore, a technique for solving the disadvantage of the conventional three-dimensional flash memory needs to be proposed.

DETAILED DESCRIPTION OF THE INVENTION

Technical Problem

One embodiment proposes a three-dimensional flash memory in which at least one memory cell string chip and a peripheral circuit chip are connected to each other using at least one TSV to improve integration thereof.

Further, one embodiment proposes a three-dimensional flash memory in which in order to lower a manufacturing process cost, at least one memory cell string chip and a peripheral circuit chip are respectively manufactured via different simplified processes, and, to this end, the three-dimensional flash memory employs at least one memory cell string chip composed only of a plurality of memory cell strings and a peripheral circuit chip composed only of at least one peripheral circuit.

Further, one embodiment proposes a three-dimensional flash memory in which in order to improve integration thereof, at least one drain line is respectively disposed at a bottom of at least one memory cell string, so that the at least one drain line is connected to a wiring of at least one transistor by the smallest distance.

An embodiment proposes a three-dimensional flash memory and a method for manufacturing the same in which in order to solve the disadvantages of the conventional three-dimensional flash memory, complexity of a source line manufacturing process is lowered, and cell integration is improved.

More specifically, one embodiment proposes a three-dimensional flash memory including a common source line buried in a substrate and a method for manufacturing the same.

Technical Solution

According to one embodiment, a TSV (Through Silicon Via)-based three-dimensional flash memory having high integration includes at least one memory cell string chip including a plurality of memory cell strings, and a peripheral circuit chip including at least one peripheral circuit, wherein the peripheral circuit chip is disposed under the at least one memory cell string chip and is connected to the at least one memory cell string chip via at least one TSV.

According to one aspect, the at least one memory cell string chip may be composed only of the plurality of memory cell strings, wherein the peripheral circuit chip may be composed only of the at least one peripheral circuit.

According to one aspect, the peripheral circuit chip may be connected to the at least one memory cell string chip via the at least one TSV extending through the at least one memory cell string chip.

According to one aspect, the at least one memory cell string chip may include a plurality of memory cell string chips, wherein the peripheral circuit chip may be disposed under one memory cell string chip among the plurality of memory cell string chips and may be connected to the one memory cell string chip via the at least one TSV, wherein the one memory cell string chip may be disposed under one remaining memory cell string chip among the plurality of memory cell string chips and may be connected to the one remaining memory cell string chips via the at least one TSV.

According to one embodiment, a three-dimensional flash memory having a COP (Cell On Peripheral circuit) structure includes a substrate in which at least one transistor is formed, at least one memory cell string disposed on the substrate and extending in one direction, and at least one drain line corresponding to the at least one memory cell string, respectively, and disposed on a bottom of the at least one memory cell string, respectively.

According to one aspect, the at least one drain line may be respectively disposed on the bottom of the at least one memory cell string so that a distance between the at least one drain line and the at least one transistor may be the smallest.

According to one aspect, the at least one drain line may be respectively connected to a wiring of the at least one transistor.

According to one aspect, the at least one drain line may be respectively disposed on the bottom of the at least one memory cell string such that the at least one drain line may be respectively connected to the wiring of the at least one transistor by the smallest distance.

According to one aspect, a connection portion of the at least one drain line connected to the wiring of the at least one transistor, respectively, may be positioned in an area of the substrate vertically overlapping the at least one memory cell string.

According to one embodiment, a three-dimensional flash memory includes at least one memory cell string formed on a substrate and extending in one direction, and including a channel layer and a charge storage layer, a plurality of word-lines arranged vertically and connected to the at least one memory cell string and extending in a direction perpendicular to the at least one memory cell string, and at least one buried source line buried in the substrate.

According to one aspect, the at least one buried source line may be made of a conductive material different from a material of the substrate.

According to one aspect, at least one slit line used in a process of forming the plurality of word-lines may be defined on the at least one buried source line.

According to one aspect, an insulating film may fill the at least one slit line after the plurality of word-lines have been formed.

According to one aspect, the at least one buried source line may be connected via the at least one memory cell string via the substrate.

According to one aspect, the at least one buried source line may have a minimized width sized to satisfy a condition that the at least one buried source line can be used as a common source electrode for the at least one memory cell string.

Advantageous Effects of the Invention

One embodiment may achieve a three-dimensional flash memory in which at least one memory cell string chip and a peripheral circuit chip are connected to each other using at least one TSV to improve integration of the three-dimensional flash memory.

Further, one embodiment may achieve a three-dimensional flash memory using at least one memory cell string chip composed only of a plurality of memory cell strings and a peripheral circuit chip composed only of at least one peripheral circuit such that the at least one memory cell string chip and the peripheral circuit chip are respectively manufactured via different simplified processes, thereby lowering a manufacturing process cost.

One embodiment may achieve a three-dimensional flash memory in which at least one drain line is disposed at a bottom of at least one memory cell string, respectively, and thus the at least one drain line is connected to a wiring of at least one transistor by the smallest distance, respectively, such that a connection portion of the at least one drain line to the wiring of the at least one transistor is located in an area in a substrate vertically overlapping the at least one memory cell string.

Thus, one embodiment may suggest a three-dimensional flash memory with improved integration.

One embodiment may achieve a three-dimensional flash memory and a method for manufacturing the same in which the complexity of the source line manufacturing process is lowered, and cell integration is improved, thereby solving the disadvantages of the conventional three-dimensional flash memory.

More specifically, one embodiment may achieve a three-dimensional flash memory including a common source line buried in a substrate and a method for manufacturing the same.

Accordingly, one embodiment may achieve a three-dimensional flash memory and a method for manufacturing the same in which a buried source line is connected to a memory cell string via a substrate and, such that a wiring for connecting the source line to the memory cell string is removed, so that a wiring layout design may be simplified.

DESCRIPTION OF THE DRAWINGS

FIG. 5 is a flowchart showing a method for manufacturing a three-dimensional flash memory according to one embodiment.

FIGS. 7 to 8 are X-Z cross-sectional views showing a three-dimensional flash memory according to another embodiment.

FIGS. 10A to 10B are X-Z cross-sectional views showing a three-dimensional flash memory to illustrate a method for manufacturing a three-dimensional flash memory according to another embodiment.

FIG. 11 is an X-Z cross-sectional view showing a conventional three-dimensional flash memory.

FIG. 13 is a flowchart showing a method for manufacturing a three-dimensional flash memory according to one embodiment.

FIGS. 14A to 14E are X-Z cross-sections of a three-dimensional flash memory to illustrate a method for manufacturing a three-dimensional flash memory.

FIG. 18 is a flowchart showing a method for manufacturing a three-dimensional flash memory according to one embodiment.

FIG. 20 is a flowchart showing a method for manufacturing a three-dimensional flash memory according to another embodiment.

BEST MODE

Figure 1:
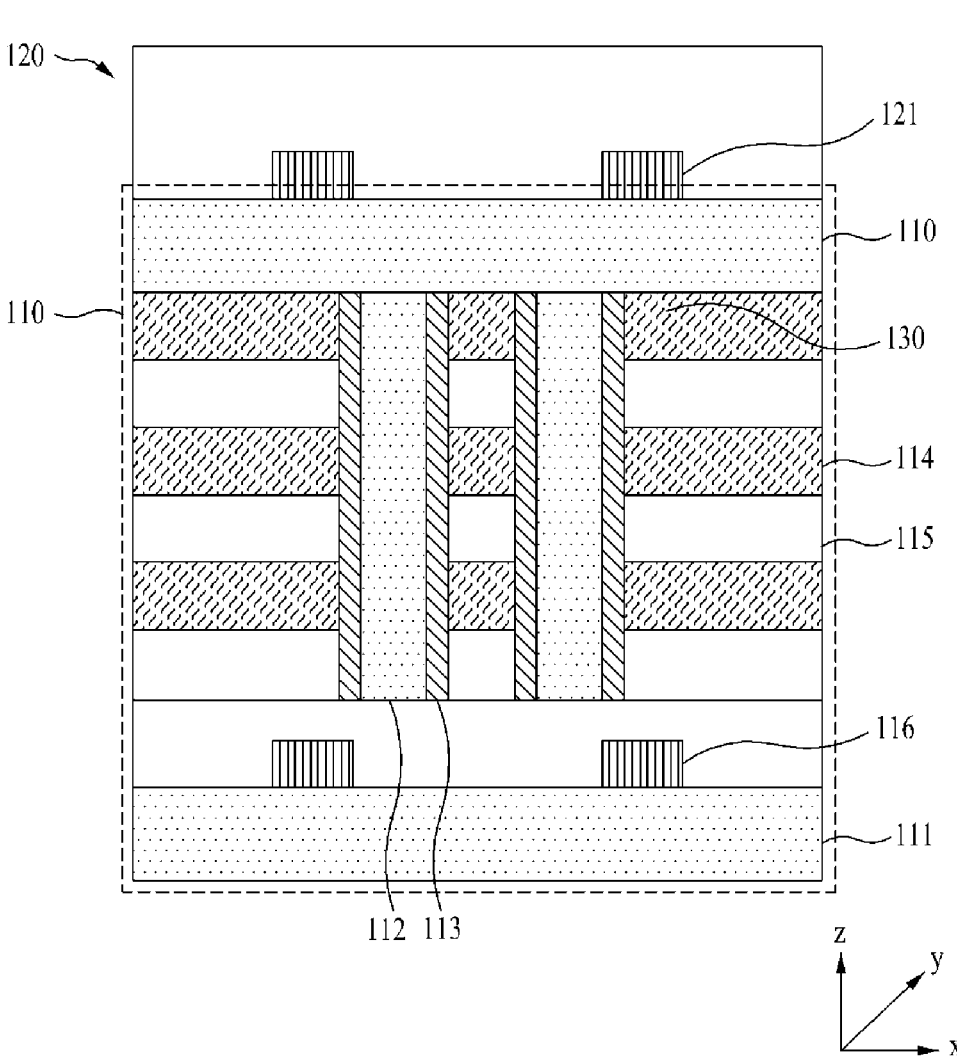
FIG. 1 is an X-Z cross-sectional view showing a conventional three-dimensional flash memory.

Hereinafter, embodiments will be described in detail with reference to the accompanying drawings. However, the present disclosure is not limited to the embodiments. Further, the same reference number in the drawings indicates the same member.

Further, as used herein, the terminologies are used to appropriately describe a preferred embodiment of the present disclosure, and may vary depending on intention of a user or an operator or a practice of a field to which the present disclosure belongs. Therefore, definitions of the terms used therein should be made based on the present disclosure.

Figure 2:
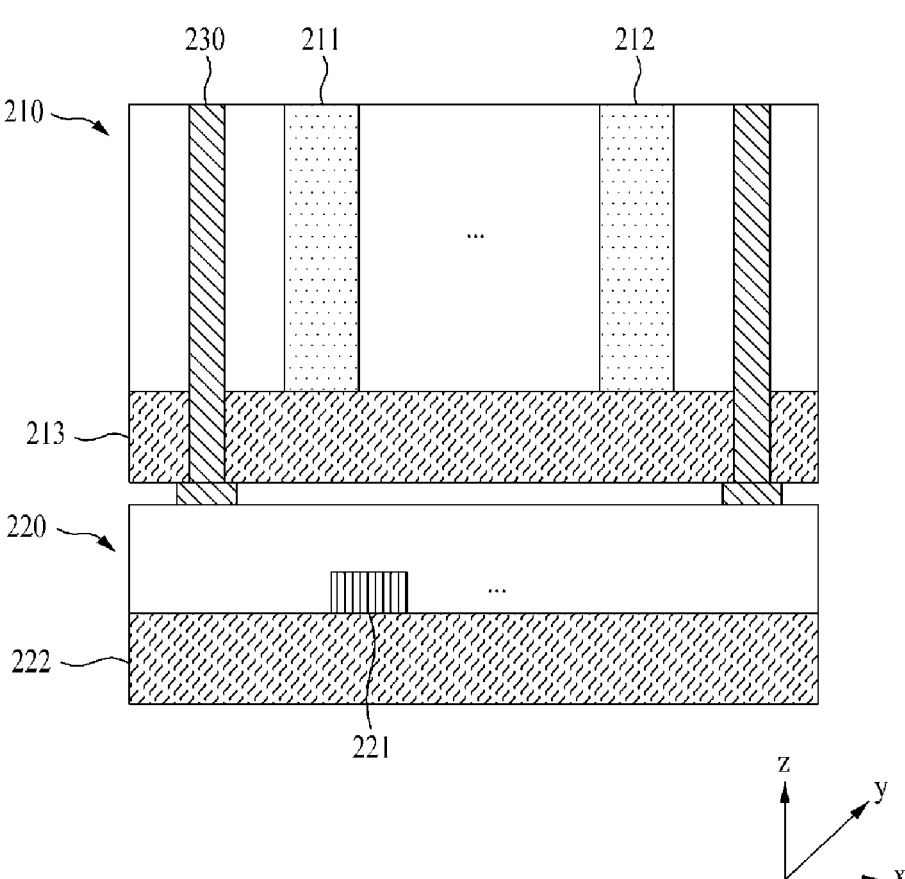
FIGS. 2 to 4 are X-Z cross-sectional views showing a three-dimensional flash memory according to one embodiment.
Figure 3:
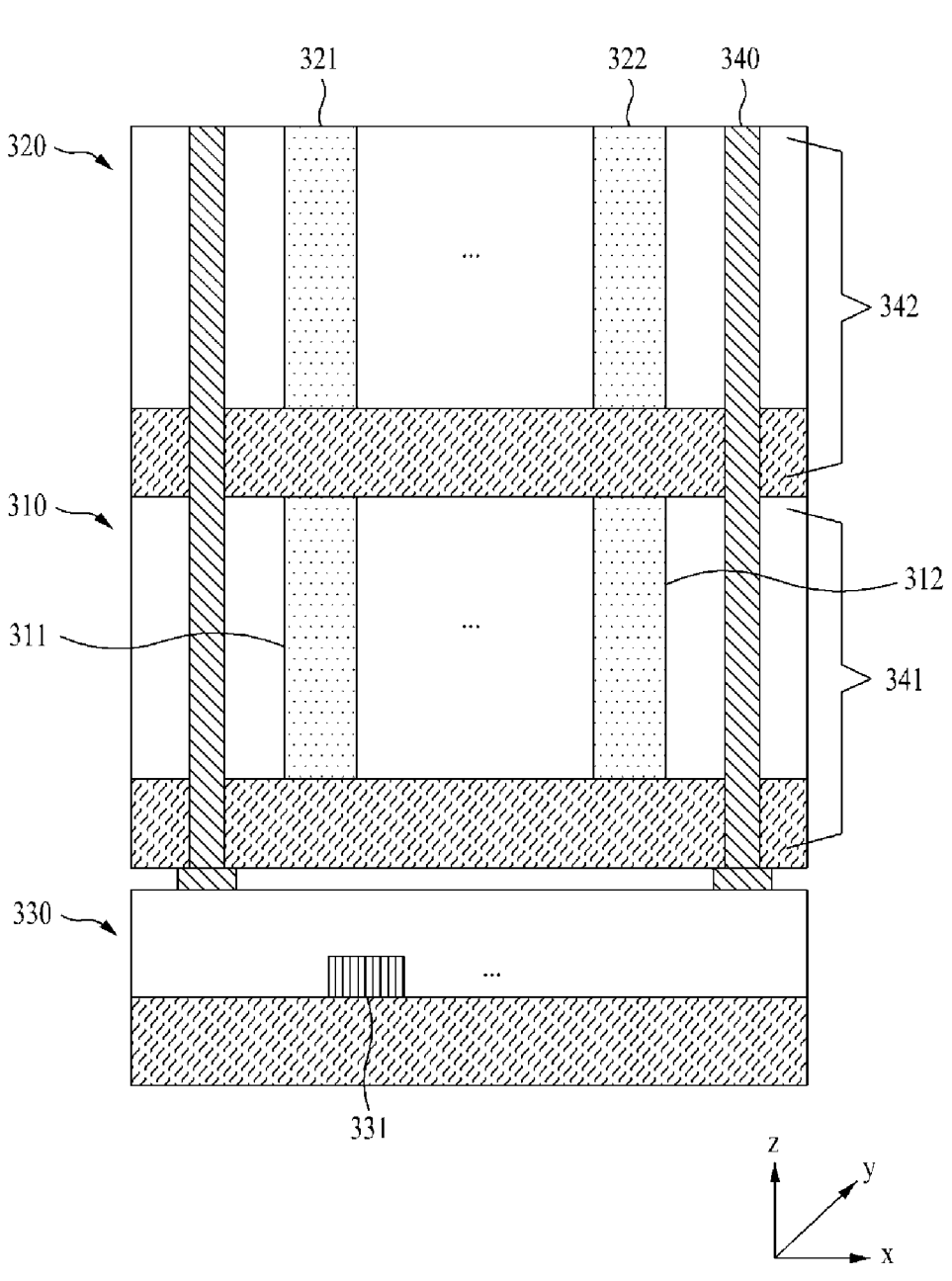
Figure 4:
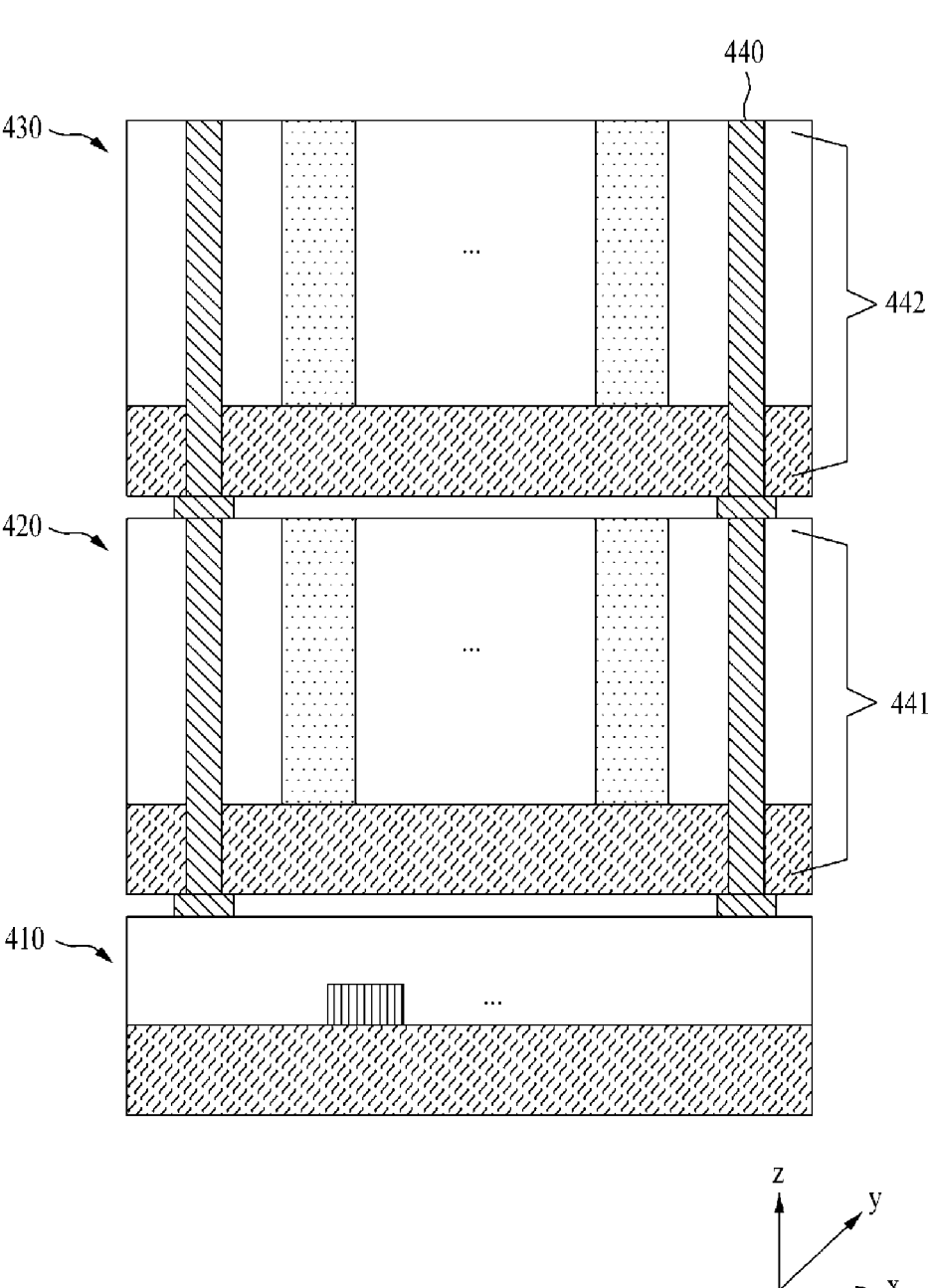

FIGS. 2 to 4 are X-Z cross-sectional views showing a three-dimensional flash memory according to one embodiment.

Referring to FIG. 2, a three-dimensional flash memory 200 according to one embodiment includes at least one memory cell string chip 210 including a plurality of memory cell strings 211 and 212, and a peripheral circuit chip 220 including at least one peripheral circuit 221, wherein the at least one memory cell string chip 210 and the peripheral circuit chip 220 are connected to each other using at least one TSV (Through Silicon Via) 230.

In this regard, the at least one memory cell string chip 210 may be composed of a substrate 213 and the plurality of memory cell strings 211 and 212 disposed on the substrate 213 and extending in one direction (e.g., Z direction). The peripheral circuit chip 220 may include a substrate 222 and the at least one peripheral circuit 221 formed on the substrate 222. Each of the substrates 213 and 222 is a component acting as a base in a semiconductor manufacturing process and is obviously included in a semiconductor structure. Thus, hereinafter, the at least one memory cell string chip 210 may be interpreted as being composed of only the plurality of memory cell strings 211 and 212, and the peripheral circuit chip 220 may also be interpreted as being composed of only the at least one peripheral circuit 221. Further, hereafter, the at least one memory cell string chip 210 being composed of only the plurality of memory cell strings 211 and 212 means that the at least one memory cell string chip 210 is free of a transistor (in one example, a transistor of the at least one peripheral circuit) unrelated to the plurality of memory cell strings 211 and 212. The peripheral circuit chip 220 being composed of only the at least one peripheral circuit 221 means that the peripheral circuit chip 220 does not include at least one memory cell string.

Because the at least one memory cell string chip 210 is composed of only the plurality of memory cell strings 211 and 212, and the peripheral circuit chip 220 is composed of only the at least one peripheral circuit 221, the at least one memory cell string chip 210 and the peripheral circuit chip 220 are respectively manufactured via different simplified processes, so that a manufacturing cost may be reduced.

An example in which each of the plurality of memory cell strings 211 and 212 is as a component extending in the vertical direction in the drawing is described for convenience of illustration. However, each of the plurality of memory cell strings 211 and 212 may include vertical elements such as a channel layer extending in one direction (e.g., Z direction) from the substrate 213, and a charge storage layer (in one example, ONO (oxide-nitride-oxide)) surrounding the channel layer, and horizontal elements such as a plurality of electrode layers connected to the charge storage layer and extending in a horizontal direction. The channel layer may be made of single crystal silicon or polysilicon, and the charge storage layer may be formed to have a structure (in one example, an ONO (oxide-nitride-oxide) structure) configured to store therein charges based on a voltage applied via the plurality of electrode layers. Each of the plurality of electrode layers may be made of a conductive material such as tungsten (W), titanium (Ti), tantalum (Ta), copper (Cu), or gold (Au) to enable voltage application to the charge storage layer.

More specifically regarding the connection between the at least one memory cell string chip 210 and the peripheral circuit chip 220 via the at least one TSV 230, the peripheral circuit chip 220 may be connected to the at least one memory cell string chip 210 using the at least one TSV 230 while being disposed under the at least one memory cell string chip 210.

In particular, the peripheral circuit chip 220 and the at least one memory cell string chip 210 are connected to each other using the at least one TSV 230 extending through the at least one memory cell string chip 210. In this regard, because the at least one TSV 230 can be formed in a hole etched in a process of forming the plurality of memory cell strings 211 and 212 during a manufacturing process of the at least one memory cell string chip 210, a separate process for manufacturing a hole to form the at least one TSV 230 is unnecessary. Therefore, the peripheral circuit chip 220 may be connected to the at least one memory cell string chip 210 using the at least one TSV 230 extending through the at least one memory cell string chip 210, such that a separate manufacturing process for forming a hole for forming the at least one TSV 230 may be omitted.

In this way, in the three-dimensional flash memory 200 according to one embodiment, the at least one memory cell string chip 210 and the peripheral circuit chip 220 respectively manufactured through different simplified processes are connected to each other using the at least one TSV 230 extending through the at least one memory cell string chip 210. Thus, the manufacturing process cost in a process of manufacturing and preparing the at least one memory cell string chip 210 may be reduced compared to that in a conventional structure in which at least one memory cell string chip further includes at least one peripheral circuit. A separate process for manufacturing a hole to form the at least one TSV 230 may be omitted, so that a hole manufacturing process cost may be reduced.

Referring to FIG. 3, a three-dimensional flash memory 300 according to one embodiment represents a case in which the at least one memory cell string chip 210 includes a plurality of memory cell string chips in the three-dimensional flash memory 200 as shown in FIG. 2.

Specifically, the three-dimensional flash memory 300 may include a plurality of memory cell string chips 310 and 320, each including a plurality of memory cell strings 311, 312, 321 and 322, and a peripheral circuit chip 330 including at least one peripheral circuit 331, wherein the plurality of memory cell string chips 310 and 320 and the peripheral circuit chip 330 are connected to each other via at least one TSV 340.

Similarly, each of the plurality of memory cell string chips 310 and 320 may be composed of only the plurality of memory cell strings 311, 312, 321 and 322. The peripheral circuit chip 330 may be composed of only the at least one peripheral circuit 331. Thus, the plurality of memory cell string chips 310 and 320 and the peripheral circuit chip 330 are respectively manufactured through different simplified processes, thereby reducing a manufacturing cost.

More specifically regarding the connection of the plurality of memory cell string chips 310 and 320 and the peripheral circuit chip 330 to each other via the at least one TSV 340, the peripheral circuit chip 330 may be connected to the one memory cell string chip 310 among the plurality of memory cell string chips 310 and 320 using the at least one TSV 340 while being disposed under the one memory cell string chip 310 among the plurality of memory cell string chips 310 and 320. The one memory cell string chip 310 may be disposed under the other memory cell string chip 320 among the plurality of memory cell string chips 310 and 320 and may be connected to the other memory cell string chip 320 using the at least one TSV 340. Accordingly, the peripheral circuit chip 330 and the other memory cell string chip 320 may also be indirectly connected to each other via the at least one TSV 340 extending through one memory cell string chip 310.

It has been described above that two memory cell string chips 310 and 320 are included in the three-dimensional flash memory 300. However, the present disclosure is not limited thereto. Three or more memory cell string chips may be included in the three-dimensional flash memory 300. In this case, the three-dimensional flash memory 300 may have the same structure as the structure as described that the peripheral circuit chip 330 is disposed at a bottom and the three or more memory cell string chips 310 and 320 are sequentially stacked on top of the peripheral circuit chip 330, and is connected to the three or more memory cell string chips 310 and 320 via the at least one TSV 340.

In this regard, a portion 341 of the at least one TSV 340 connecting the peripheral circuit chip 330 to the one memory cell string chip 310 may be integrally formed with a portion 342 of the at least one TSV 340 connecting the one memory cell string chip 310 to the other memory cell string chip 320. However, a structure of the at least one TSV 340 is not limited thereto. A detailed description thereof will be made in FIG. 4 below.

Referring to FIG. 4, a three-dimensional flash memory 400 according to one embodiment has the same structure as that of the three-dimensional flash memory 300 as shown in FIG. 3, but is different therefrom that a portion 441 of at least one TSV 440 connecting a peripheral circuit chip 410 to one memory cell string chip 420 of a plurality of memory cell string chips 420 and 430 is separate from a portion 442 of the at least one TSV 440 connecting one memory cell string chip 420 to the other memory cell string chip 430.

In each of the three-dimensional flash memories 200, 300, and 400 having the structure as described above with reference to FIGS. 2 to 4, the at least one memory cell string chip 210, 310, 320, 420, or 430 may be connected to the peripheral circuit chip 220, 330, or 410 using the at least one TSV 230, 340, or 440. Thus, the integration of the three-dimensional flash memory may be improved.

Figure 6A:
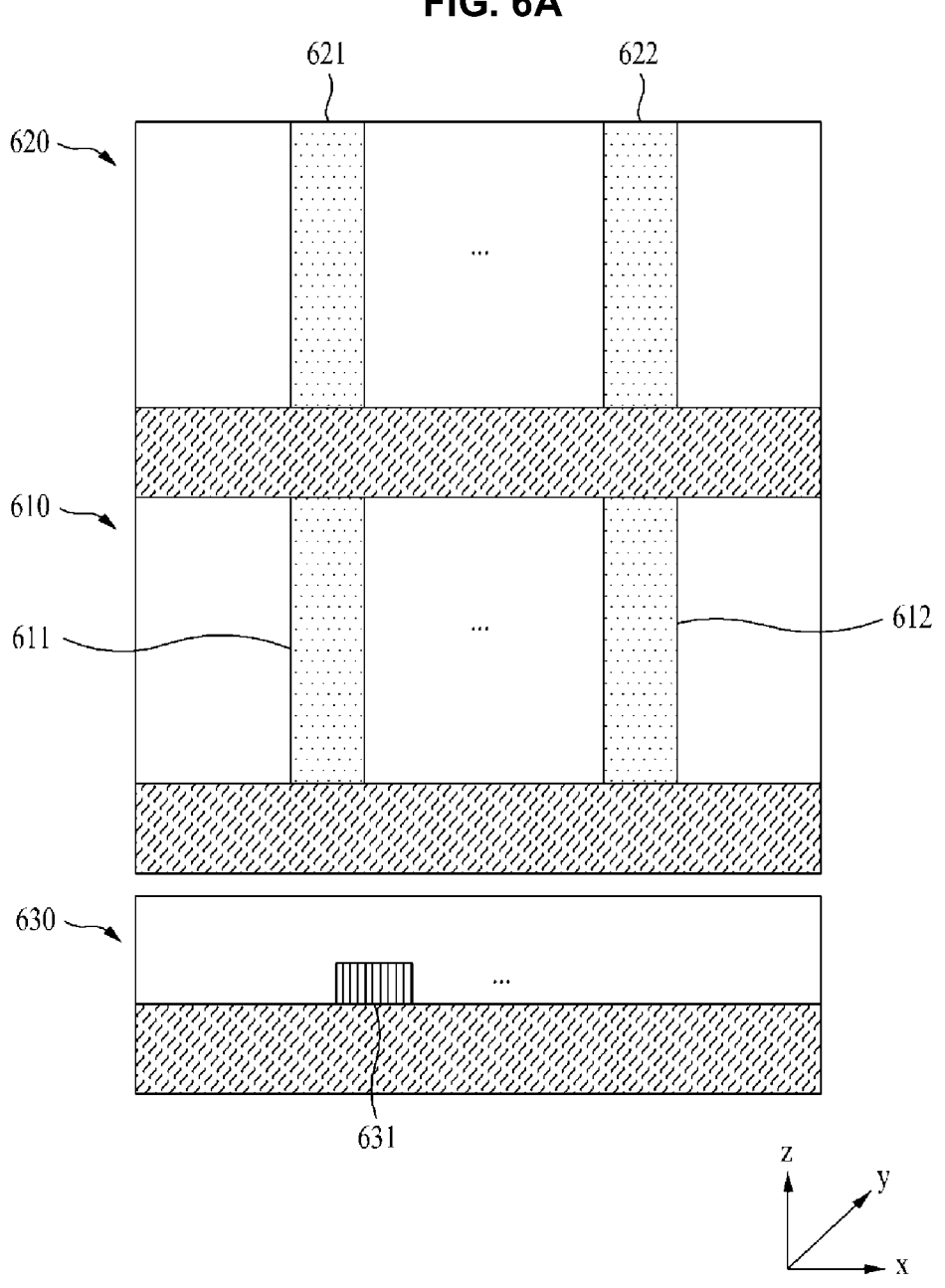
FIG. 6A to FIG. 6B are X-Z cross-sectional views showing a three-dimensional flash memory to illustrate a method for manufacturing a three-dimensional flash memory according to one embodiment.
Figure 6B:
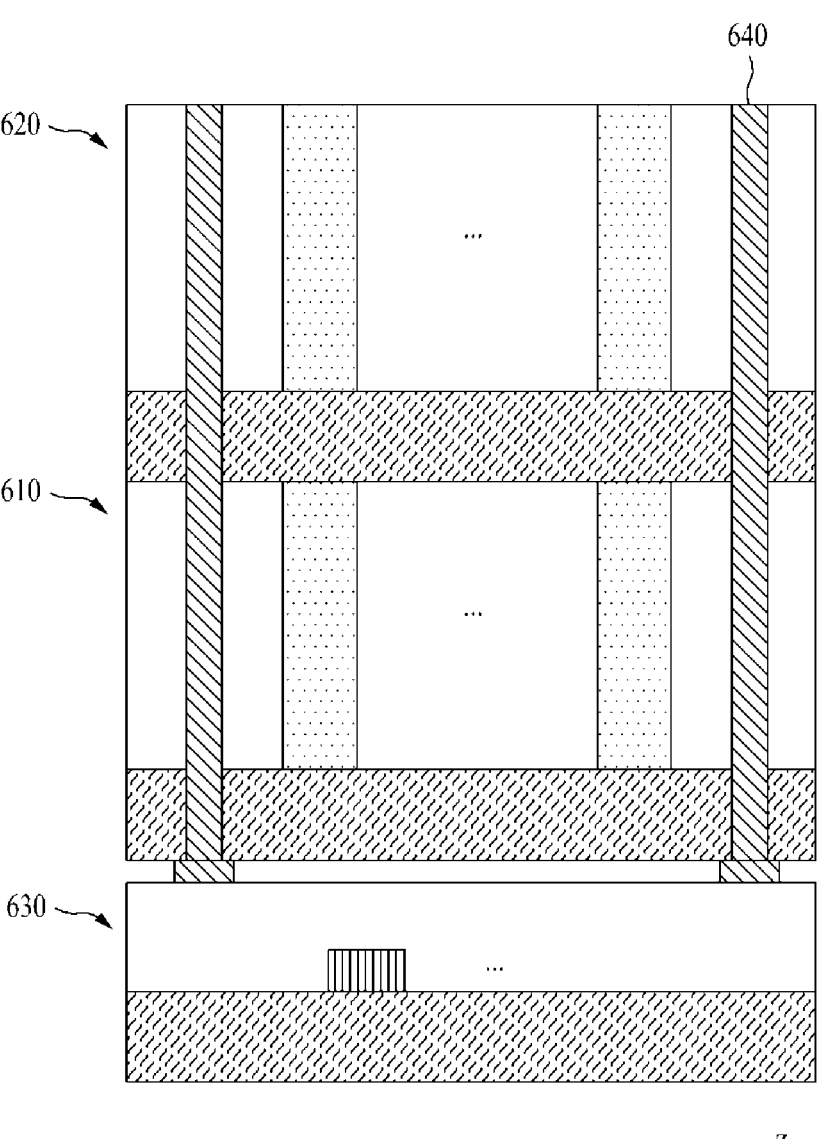

FIG. 5 is a flowchart showing a method for manufacturing a three-dimensional flash memory according to one embodiment. FIGS. 6A to 6B are X-Z cross-sectional views illustrating a three-dimensional flash memory to illustrate a method for manufacturing a three-dimensional flash memory according to one embodiment. Hereinafter, FIGS. 6A to 6B are related to a method for manufacturing the three-dimensional flash memory 300 as shown in FIG. 3. However, the manufacturing method as described below is not limited thereto. That is, using the manufacturing method as described below, the three-dimensional flash memory 200 as shown in FIG. 2 as well as the three-dimensional flash memory 400 as shown in FIG. 4 may be manufactured. Further, hereinafter, it is assumed that the manufacturing method is performed by an automated and mechanized manufacturing system.

Referring to FIGS. 5 and 6A to 6B, in Step S510, the manufacturing system prepares at least one memory cell string chip including a plurality of memory cell strings and a peripheral circuit chip including at least one peripheral circuit.

For example, in Step S510, the manufacturing system may prepare a plurality of memory cell string chips 610 and 620, each composed of only a plurality of memory cell strings 611, 612, 621, and 622, and a peripheral circuit chip 630 composed of only at least one peripheral circuit 631, as shown in FIG. 6A.

Thereafter, in Step S520, the manufacturing system connects the at least one memory cell string chip to the peripheral circuit chip using at least one TSV while the peripheral circuit chip is disposed under the at least one memory cell string chip.

In particular, in Step S520, the manufacturing system connects the peripheral circuit chip composed only of the at least one peripheral circuit to the at least one memory cell string chip composed only of the plurality of memory cell strings using the at least one TSV extending through the at least one memory cell string chip. Thus, a manufacturing process cost in a process of manufacturing and preparing the at least one memory cell string chip may be reduced, compared to that in the conventional structure in which at least one memory cell string chip further includes at least one peripheral circuit. Further, a separate process for manufacturing a hole for forming the at least one TSV may be omitted, thereby reducing a hole manufacturing process cost.

For example, in Step S520, the manufacturing system forms at least one TSV 640 extending through the plurality of memory cell string chips 610 and 620 as shown in FIG. 6B, and then, connects the peripheral circuit chip 630 to the one memory cell string chip 610 of the plurality of memory cell string chips 610 and 620 using the at least one TSV 640, and at the same time, connects the one memory cell string chip 610 to the other memory cell string chip 620 among the plurality of memory cell string chips 610 and 620.

The at least one TSV 640 of the described example is constructed such that a portion thereof connecting the peripheral circuit chip 630 to the one memory cell string chip 610 and a portion thereof connecting the one memory cell string chip 610 to the other memory cell string chip 620 are integral with each other. However, the present disclosure is not limited thereto. The two portions of the at least one TSV 640 may be separate portions. An example as not shown in the figure in which the portion of the at least one TSV 640 connecting the peripheral circuit chip 630 to the one memory cell string chip 610 and the portion thereof connecting the one memory cell string chip 610 to the other memory cell string chip 620 are separate from each other will be described as follows. In Step S520, the manufacturing system forms at least one TSV extending through each of the plurality of memory cell string chips 610 and 620 (that is, at least one TSV extending through the one memory cell string chip 610 and at least one TSV extending through the other memory cell string chip 620), and then, connects one memory cell string chip 610 to the other memory cell string chip 620 so that the at least one TSV extending through the one memory cell string chip 610 and the at least one TSV extending through the other memory cell string chip 620 come into contact with each other, and at the same time, connects the peripheral circuit chip 630 disposed under the one memory cell string chip 610 to the one memory cell string chip 610 using the at least one TSV extending through the one memory cell string chip 610.

Referring to FIGS. 6A to 6B, a method for manufacturing a three-dimensional flash memory in which the plurality of memory cell string chips 610 and 620 are included has been described. However, a method for manufacturing a three-dimensional flash memory including one memory cell string chip may also be performed based on the same Steps S510 to S520.

Figure 7:
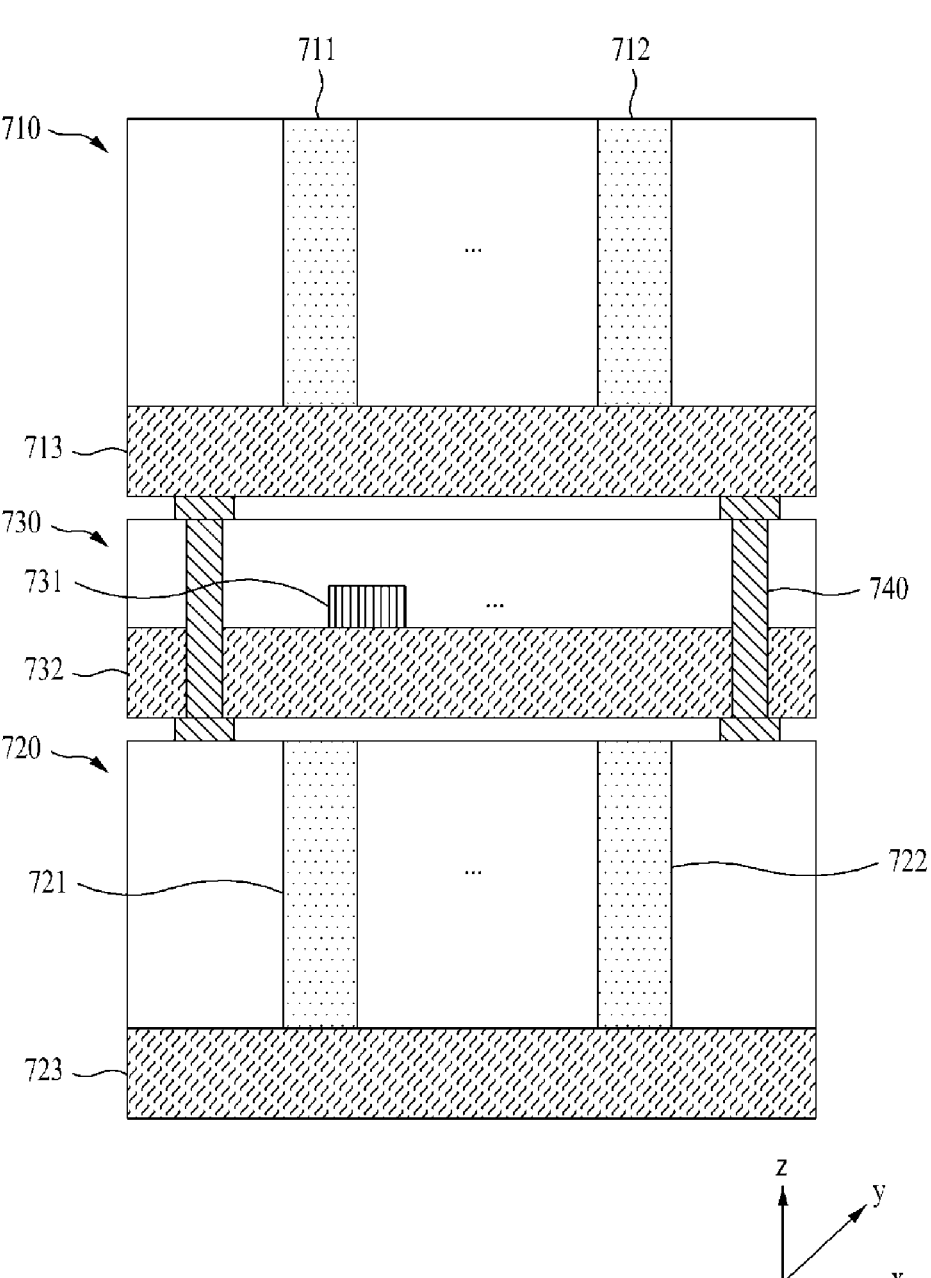

FIGS. 7 to 8 are X-Z cross-sectional views showing a three-dimensional flash memory according to another embodiment.

Referring to FIG. 7, a three-dimensional flash memory 700 according to another embodiment may include two memory cell string chips 710 and 720, each including a plurality of memory cell strings 711, 712, 721 and 722, and a peripheral circuit chip 730 including at least one peripheral circuit 731, wherein the two memory cell string chips 710 and 720 and the peripheral circuit chip 730 may be connected to each other using at least one TSV (Through Silicon Via) 740.

In this regard, each of the two memory cell string chips 710 and 720 includes each of substrates 713 and 723 and the plurality of memory cell strings 711, 712, 721, and 722 disposed on each of the substrates 713 and 723 and extending in one direction (e.g., a Z direction). The peripheral circuit chip 730 may include a substrate 732 and the at least one peripheral circuit 731 formed on the substrate 732. Each of the substrates 713, 723, and 733 is a component acting as a base in a semiconductor manufacturing process and thus is obviously included in a semiconductor structure. Thus, hereinafter, each of the two memory cell string chips 710 and 720 may be interpreted as being composed only of the plurality of memory cell strings 711, 712, 721, and 722. The peripheral circuit chip 730 may also be interpreted as being composed of the only at least one peripheral circuit 731. Further, hereinafter, each of the two memory cell string chips 710 and 720 being composed of only the plurality of memory cell strings 711, 712, 721 and 722 means that each of the two memory cell string chips 710 and 720 is free of a transistor (in one example, a transistor of the at least one peripheral circuit) unrelated to the plurality of memory cell strings 711, 712, 721, and 722. The peripheral circuit chip 730 being composed of only the at least one peripheral circuit 731 means that the peripheral circuit chip 730 does not include at least one memory cell string.

Because each of the two memory cell string chips 710 and 720 is composed of only the plurality of memory cell strings 711, 712, 721 and 722, and the peripheral circuit chip 730 is composed of only the at least one peripheral circuit 731, the two memory cell string chips 710 and 720 and the peripheral circuit chip 730 are respectively manufactured via different simplified processes, so that a manufacturing cost may be reduced.

An example in which each of the plurality of memory cell strings 711, 712, 721, and 722 is as a component extending in the vertical direction in the drawing is described for convenience of illustration. However, each of the plurality of memory cell strings 711, 712, 721, and 722 may include vertical elements such as a channel layer extending in one direction (e.g., Z direction) from each of the substrates 713 and 723, and a charge storage layer (in one example, ONO (oxide-nitride-oxide)) surrounding the channel layer, and horizontal elements such as a plurality of electrode layers connected to the charge storage layer and extending in a horizontal direction. The channel layer may be made of single crystal silicon or polysilicon, and the charge storage layer may be formed to have a structure (in one example, an ONO (oxide-nitride-oxide) structure) configured to store therein charges based on a voltage applied via the plurality of electrode layers. Each of the plurality of electrode layers may be made of a conductive material such as tungsten (W), titanium (Ti), tantalum (Ta), copper (Cu), or gold (Au) to enable voltage application to the charge storage layer.

More specifically regarding the connection between the two memory cell string chips 710 and 720 and the peripheral circuit chip 730 using the at least one TSV 740, the peripheral circuit chip 730 may be connected to each of the two memory cell string chips 710 and 720 using the at least one TSV 740 while being disposed between the two memory cell string chips 710 and 720.

In particular, the peripheral circuit chip 730 and each of the two memory cell string chips 710 and 720 are connected to each other using the at least one TSV 740 extending through the peripheral circuit chip 730. More specifically, the peripheral circuit chip 730 may be connected to each of the two memory cell string chips 710 and 720 located above and below the peripheral circuit chip 730, respectively, using the at least one TSV 740 extending through the peripheral circuit chip 730.

In this way, in the three-dimensional flash memory 700 according to another embodiment, the two memory cell string chips 710 and 720 and the peripheral circuit chip 730 as manufactured through different simplified processes, respectively, are connected to each other using the at least one TSV 740 extending through the peripheral circuit chip 730. Thus, a manufacturing process cost in a manufacturing and preparation process of the two memory cell string chips 710 and 720 may be reduced, compared to that in the conventional structure in which the memory cell string chip further includes at least one peripheral circuit.

Referring to FIG. 8, a three-dimensional flash memory 800 according to another embodiment represents a case in which, in the three-dimensional flash memory 700 as shown in FIG. 7, the peripheral circuit chip 730 includes a plurality of peripheral circuit chips, and thus the two memory cell string chips 710 and 720 include at least three memory cell string chips.

Specifically, in the three-dimensional flash memory 800, one peripheral circuit chip 810 and the other peripheral circuit chip 820 among the plurality of peripheral circuit chips 810 and 820 share one memory cell string chip 830 among at least three or more memory cell string chips 830, 840, and 850, and each of the one peripheral circuit chip 810 and the other peripheral circuit chip 820 among the plurality of peripheral circuit chips 810 and 820 is connected to the one memory cell string chip 830.

Similarly, each of the at least three or more memory cell string chips 830, 840, and 850 may be composed of only a plurality of memory cell strings, and each of the plurality of peripheral circuit chips 810 and 820 may be composed of only at least one peripheral circuit. Thus, the at least three or more memory cell string chips 830, 840, and 850 and the plurality of peripheral circuit chips 810 and 820 are respectively manufactured via different simplified processes, such that a manufacturing cost may be reduced.

More specifically regarding the connections between the at least three or more memory cell string chips 830, 840, and 850 and the plurality of peripheral circuit chips 810 and 820 via at least two TSVs 860 and 870, the first peripheral circuit chip 810 among the plurality of peripheral circuit chips 810 and 820 may be connected to each of the first memory cell string chip 830 and the second memory cell string chip 840 via the at least one TSV 860 extending through the first peripheral circuit chip 810 disposed between the first memory cell string chip 830 and the second memory cell string chip 840 among the at least three or more memory cell string chips 830, 840, and 850. The second peripheral circuit chip 820 may be connected to each of the first memory cell string chip 830 and the third memory cell string chip 850 via the at least one TSV 870 extending through the second peripheral circuit chip 820 disposed between the first memory cell string chip 830 and the third memory cell string chip 850 among the at least three or more memory cell string chips 830, 840, and 850. Accordingly, the first memory cell string chip 830 may be disposed between the first peripheral circuit chip 810 and the second peripheral circuit chip 820 and may be shared thereby and may be connected to each of the first peripheral circuit chip 810 and the second peripheral circuit chip 820. In this regard, the at least two TSVs 860 and 870 may include the at least one TSV 860 connecting the first peripheral circuit chip 810 to each of the first memory cell string chip 830 and the second memory cell string chip 840, and the at least one TSV 870 connecting the second peripheral circuit chip 820 to each of the first memory cell string chip 830 and the third memory cell string chip 850.

In the drawing, it is illustrated that the three memory cell string chips 830, 840, and 850 are included in the three-dimensional flash memory 800, and the two peripheral circuit chips 810 and 820 are included therein. However, the present disclosure is not limited thereto, and four or more memory cell string chips 830, 840, and 850 may be included therein, and three or more peripheral circuit chips 810 and 820 may be included therein. In this case, the three-dimensional flash memory 800 may have the same structure as the described structure in which each of the peripheral circuit chips 810 and 820 may be connected to corresponding two of the memory cell string chips 830, 840, and 850 disposed above and below each of the peripheral circuit chips 810 and 820, respectively. In order to realize this structure, the number of the memory cell string chips 830, 840, and 850 may be larger by one than the number of the peripheral circuit chips 810 and 820.

In this way, in each of the three-dimensional flash memories 700 and 800 of the structure as described with reference to FIGS. 7 to 8, the two or more memory cell string chips 710, 720, 830, 840, or 850 and the one or more peripheral circuit chips 730, 810, and 820 are connected to each other using the at least one TSV 740, 860, or 870. Thus, the integration of the three-dimensional flash memory may be improved.

Figure 9:
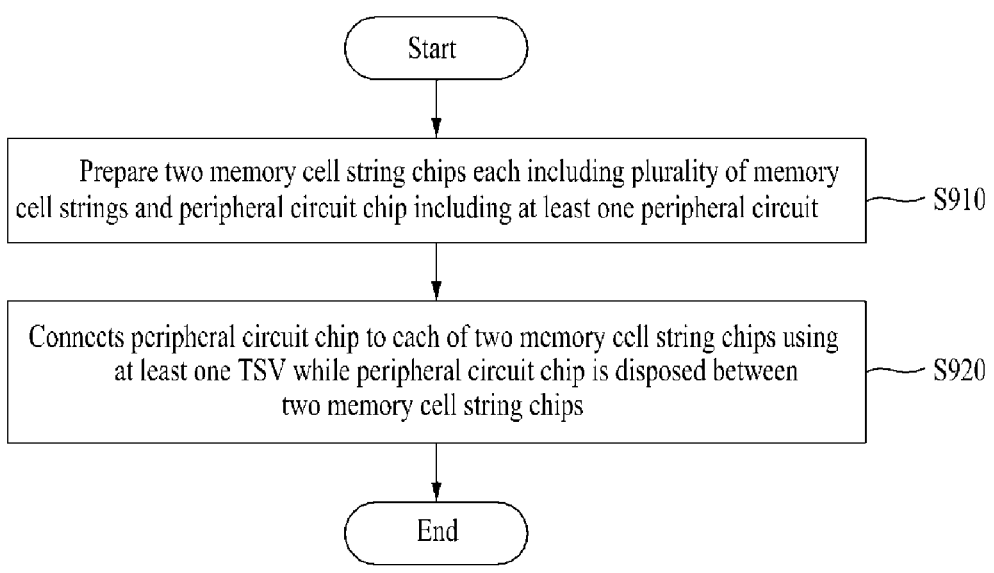
FIG. 9 is a flowchart showing a method for manufacturing a three-dimensional flash memory according to another embodiment.
Figure 10A:
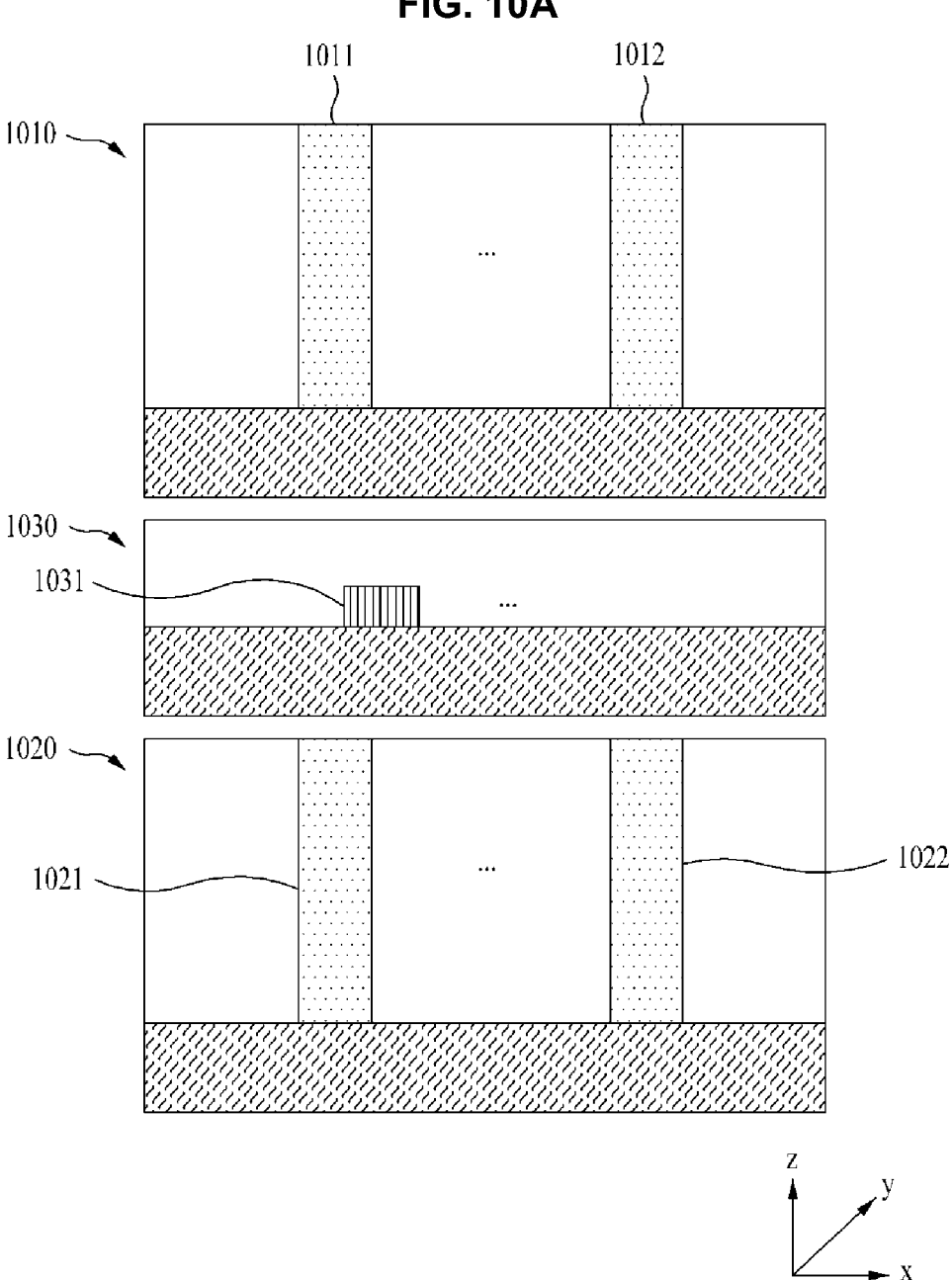
Figure 10B:
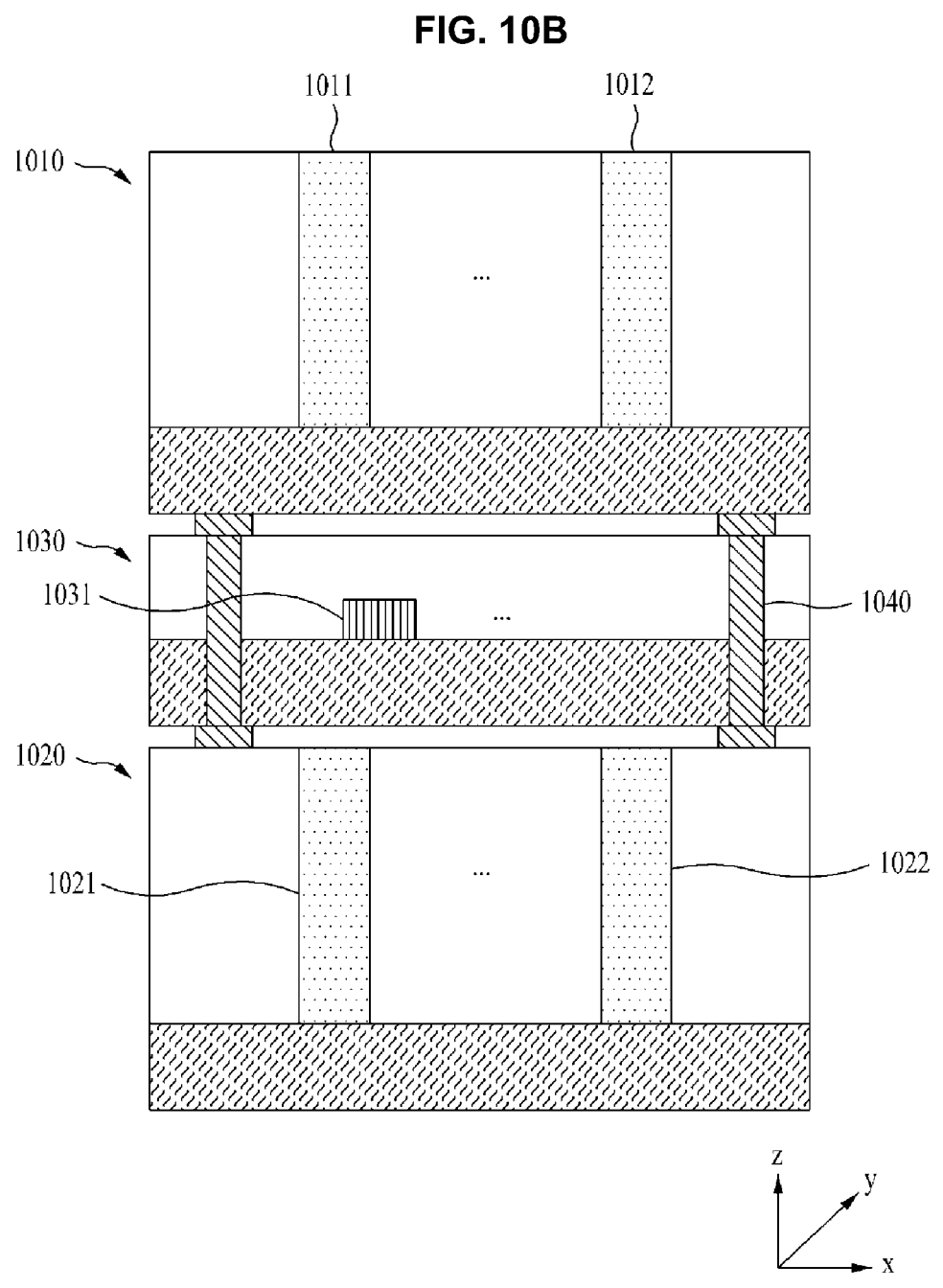

FIG. 9 is a flowchart showing a method for manufacturing a three-dimensional flash memory according to another embodiment. FIGS. 10A to 10B are X-Z cross-sectional views showing a three-dimensional flash memory to illustrate a method for manufacturing a three-dimensional flash memory according to another embodiment. Hereinafter, FIGS. 10A to 10B are related to a method for manufacturing the three-dimensional flash memory 700 as shown in FIG. 7. However, the method for manufacturing the three-dimensional flash memory as described below is not limited thereto. That is, using the manufacturing method as described later, the three-dimensional flash memory 800 as shown in FIG. 8 may be manufactured.

Further, hereinafter, it is assumed that the method for manufacturing the three-dimensional flash memory is performed by an automated and mechanized manufacturing system.

Referring to FIGS. 9 and 10A to 10B, in Step S910, the manufacturing system prepares two memory cell string chips each including a plurality of memory cell strings and a peripheral circuit chip including at least one peripheral circuit.

For example, in Step S910, the manufacturing system may prepare two memory cell string chips 1010 and 1020 each composed of only a plurality of memory cell strings 1011, 1012, 1021, and 1022, and a peripheral circuit chip 1030 composed of only at least one peripheral circuit 1031, as shown in FIG. 10A.

Then, in Step S920, the manufacturing system connects the peripheral circuit chip to each of the two memory cell string chips using at least one TSV while the peripheral circuit chip is disposed between the two memory cell string chips.

In particular, in Step S920, the manufacturing system connects the peripheral circuit chip composed of only at least one peripheral circuit into each of the memory cell string chips composed only of the plurality of memory cell strings via at least one TSV extending through the peripheral circuit chip. Thus, a manufacturing process cost in a manufacturing and preparing process of the two memory cell string chips may be reduced compared to that in a conventional structure in which two memory cell string chips further include at least one peripheral circuit.

For example, in Step S920, as shown in FIG. 10B, the manufacturing system forms at least one TSV 1040 extending through the peripheral circuit chip 1030, and then connects the peripheral circuit chip 1030 to each of the two memory cell string chips 1010 and 1020 using the at least one TSV 1040 while the peripheral circuit chip 1030 is disposed between the two memory cell string chips 1010 and 1020.

The described example relates to a method for manufacturing a three-dimensional flash memory 1000 including one peripheral circuit chip 1030 and two memory cell string chips 1010 and 1020. However, the present disclosure is not limited thereto. The above example is applicable to a three-dimensional flash memory including a plurality of peripheral circuit chips and a plurality of memory cell string chips. That is, a method for manufacturing a three-dimensional flash memory including a plurality of peripheral circuit chips and a plurality of memory cell string chips may also be performed based on the same Steps S910 to S920.

Figure 12:
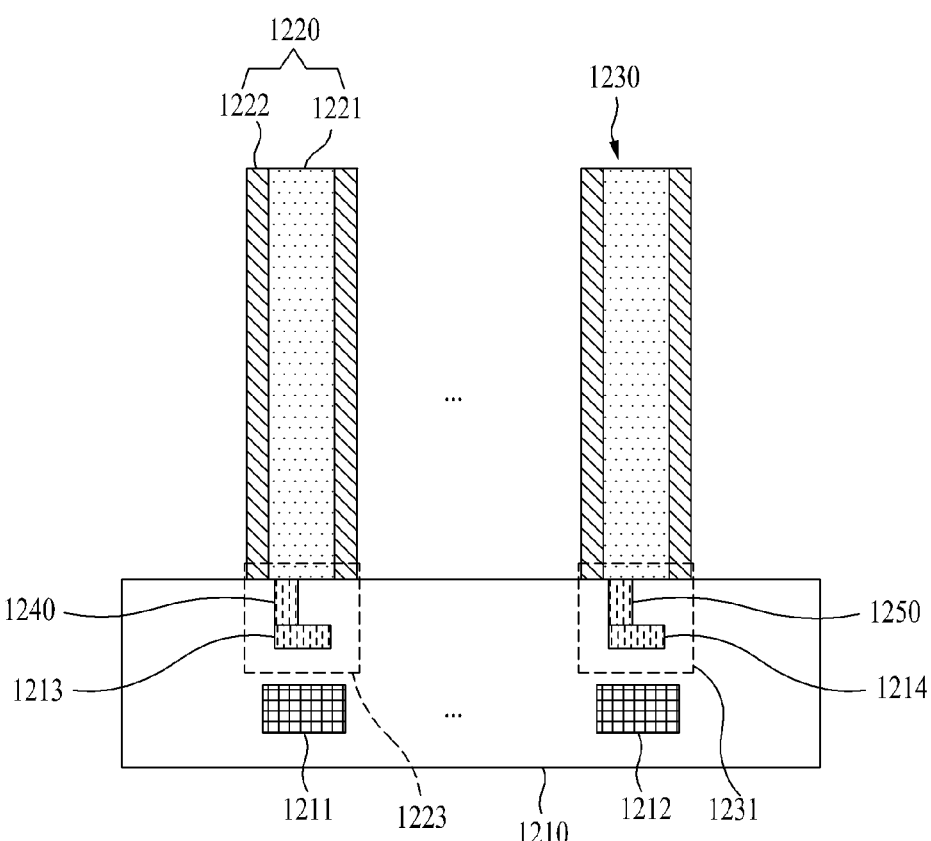
FIG. 12 is an X-Z cross-sectional view showing a three-dimensional flash memory according to one embodiment.

FIG. 12 is an X-Z cross-sectional view showing a three-dimensional flash memory according to one embodiment.

Referring to FIG. 12, a three-dimensional flash memory 1200 according to one embodiment includes a substrate 1210 in which at least one transistor 1211 and 1212 is formed, at least one memory cell string 1220 and 1230, and at least one drain line 1240 and 1250.

The at least one transistor 1211 and 1212 included in one of a core circuit related to data storage and read operations and a peripheral circuit related to other operations except for the data storage and read operations according to the COP structure may be buried in the substrate 1210. Hereinafter, the at least one transistor 1211 and 1212 being buried in the substrate 1210 may mean that the at least one transistor 1211 and 1212 is formed between an insulating layer (not shown) positioned on top of the substrate 1210 and the substrate 1210.

Each of the at least one memory cell string 1220 and 1230 may be disposed on top of the substrate 1210 and extend in one direction (e.g., a Z direction), and may be composed of a channel layer 1221 and a charge storage layer 1222 surrounding the channel layer 1221. The channel layer 1221 may be made of monocrystalline silicon or polysilicon. The charge storage layer 1222 is a component that stores therein charges from current flowing through a plurality of electrode layers (not shown). In one example, the charge storage layer 1222 may be formed to have an ONO (Oxide-Nitride-Oxide) structure. Hereinafter, an example in which each of the at least one memory cell string 1220 and 1230 includes only a vertical element extending in one direction (e.g., a Z direction) perpendicular to the substrate 1210 is described. However, the present disclosure is not limited thereto. Each of the at least one memory cell string 1220 and 1230 may include a plurality of electrode layers as horizontal elements extending in a parallel manner to the substrate 1210.

In this regard, each of the plurality of electrode layers not shown in the figure may be made of a conductive material such as tungsten (W), titanium (Ti), tantalum (Ta), copper (Cu), or gold (Au) as the same material as that of each of the plurality of electrode layers 1140 included in the conventional three-dimensional flash memory 1100 as shown in FIG. 11 and may serve as a word line. Similarly, each of a plurality of insulating layers (not shown) may be disposed between adjacent ones of the plurality of electrode layers and may be made of each of various materials having insulating ability. The plurality of insulating layers and the plurality of electrode layers may be stacked alternately with each other.

However, for convenience of illustration, the plurality of electrode layers, the plurality of insulating layers, and a source line are omitted in the drawing.

The at least one drain line 1240 and 1250 may correspond to the at least one memory cell string 1220 and 1230, respectively, and may be disposed on a bottom of the at least one memory cell string 1220 and 1230, respectively. In more detail, the at least one drain line 1240 and 1250 may be respectively disposed on a bottom of the at least one memory cell string 1220 and 1230 so that a distance thereof from the at least one transistor 1211 and 1212 is minimized. For example, the first drain line 1240 may be disposed on a bottom of the corresponding first memory cell string 1220, and the second drain line 1250 may be disposed on a bottom of the corresponding second memory cell string 1230.

In this way, the at least one drain line 1240 and 1250 being disposed on the bottom of the at least one memory cell string 1220 and 1230, respectively may be intended such that the at least one drain line 1240 and 1250 is connected to at least one wiring 1213 and 1214 of the at least one transistor 1211 and 1212 by the smallest distance, respectively.

That is, as the at least one drain line 1240 and 1250 is disposed on the bottom of the at least one memory cell string 1220 and 1230, respectively, the at least one drain line 1240 and 1250 may be connected to the at least one wiring 1213 and 1214 of the at least one transistor 1211 and 1212 by the smallest distance, respectively.

In this regard, the at least one drain line 1240 and 1250 being connected to the at least one wiring 1213 and 1214 of the at least one transistor 1211 and 1212 by the smallest distance, respectively, may mean that the at least one drain line 1240 and 1250 is respectively connected to the at least one wiring 1213 and 1214 of the at least one transistor 1211 and 1212 such that a connection portion of the at least one drain line 1240 and 1250 to the at least one wiring 1213 and 1214 of the at least one transistor 1211 and 1212, respectively, is positioned in at least one area 1223 and 1231 of the substrate 1210 vertically overlapping at least one memory cell string 1220 and 1230, respectively.

In this way, in the three-dimensional flash memory 1200 according to one embodiment, the at least one drain line 1240 and 1250 is disposed on the bottom of the at least one memory cell string 1220 and 1230, respectively, such that the at least one drain line 1240 and 1250 may be connected to the at least one wiring 1213 and 1214 of the at least one transistors 1211 and 1212 by the smallest distance. Therefore, under this structure, a connection portion of the at least one drain line 1240 and 1250 to the at least one wiring 1213 and 1214 of the at least one transistor 1211 and 1212, respectively, is located in the at least one area 1223 and 1231 of the substrate 1210 vertically overlapping the at least one memory cell string 1220 and 1230. Thus, the integration of the three-dimensional flash memory 1200 may be improved.

A detailed description of a manufacturing process of the three-dimensional flash memory 200 will be described below with reference to FIGS. 13 and 14A to 14D.

FIG. 13 is a flowchart showing a method for manufacturing a three-dimensional flash memory according to one embodiment. FIGS. 14A to 14E are X-Z cross-sections of the three-dimensional flash memory to illustrate a method for manufacturing a three-dimensional flash memory. Hereinafter, the method for manufacturing the three-dimensional flash memory as described with reference to FIGS. 13 and 14A to 14D may be applied for manufacturing the three-dimensional flash memory 1200 as described in FIG. 12. It is assumed that the method for manufacturing the three-dimensional flash memory as described with reference to FIGS. 13 and 14A to 14D is performed by an automated and mechanized manufacturing system.

Figure 14C:
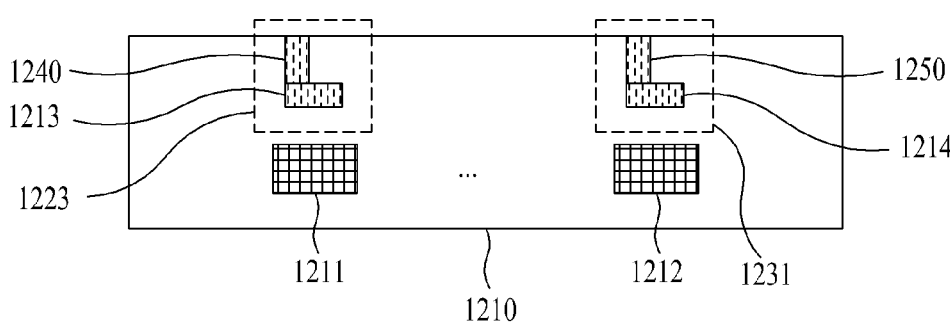

Referring to FIGS. 13 and 14A to 14E, in Step S1310, the manufacturing system prepares the substrate 1210 in which the at least one transistor 1211 and 1212 has been formed as shown in FIG. 14A. In this regard, in Step S1320, the manufacturing system may further form the at least one wiring 1213 and 1214 of the at least one transistor 1211 and 1212 in the substrate 1210, as shown in FIG. 14B. However, the present disclosure is not limited thereto. The manufacturing system may prepare the substrate 1210 in which all of the at least one transistor 1211 and 1212 and the at least one wiring 1213 and 1214 thereof are formed.

Next, in Step S1320, the manufacturing system forms the at least one drain line 1240 and 1250 corresponding to the at least one memory cell string 1220 and 1230, respectively, in the substrate 1210, as shown in FIG. 14C. More specifically, the manufacturing system forms the at least one drain line 1240 and 1250 in the substrate 1210 in Step S1320 such that the at least one drain line 1240 and 1250 may be disposed at the bottom of the at least one memory cell string 1220 and 1230, respectively, in Step S1330 as described later.

The forming of the at least one drain line 1240 and 1250 in the substrate 1210 so that the at least one drain line 1240 and 1250 may be disposed at the bottom of the at least one memory cell string 1220 and 1230, respectively may be intended such that a distance between the at least one drain line 1240 and 1250 and the at least one transistor 1211 and 1212 is minimized.

That is, in Step S1320, the manufacturing system may connect the at least one drain line 1240 and 1250 to the at least one wiring 1213 and 1214 of the at least one transistor 1211 and 1212 by the smallest distance, respectively.

In this regard, connecting the at least one drain line 1240 and 1250 to the at least one wiring 1213 and 1214 of the at least one transistor 1211 and 1212 by the smallest distance, respectively, may means positioning the connection portion of the at least one drain line 1240 and 1250 to the at least one wiring 1213 and 1214 of the at least one transistor 1211 and 1212, respectively, in the at least one area 1223 and 1231 of the substrate 1210 vertically overlapping the at least one memory cell string 1220 and 1230, respectively, and connecting the at least one drain line 1240 and 1250 to the at least one wiring 1213 and 1214 of the at least one transistor 1211 and 1212, respectively.

Then, in Step S1330, the manufacturing system forms the at least one memory cell string 1220 and 1230 on a top face of the at least one drain line 1240 and 1250, respectively, so as to extend in one direction, as shown in FIG. 14D.

Then, in a separate step (not shown), the manufacturing system may form a source line 1260 on a top face of the at least one memory cell string 1220 and 1230 as shown in FIG. 14E. In this regard, the source line 1260 may be a common source line commonly used by the at least one memory cell string 1220 and 1230.

Figure 16:
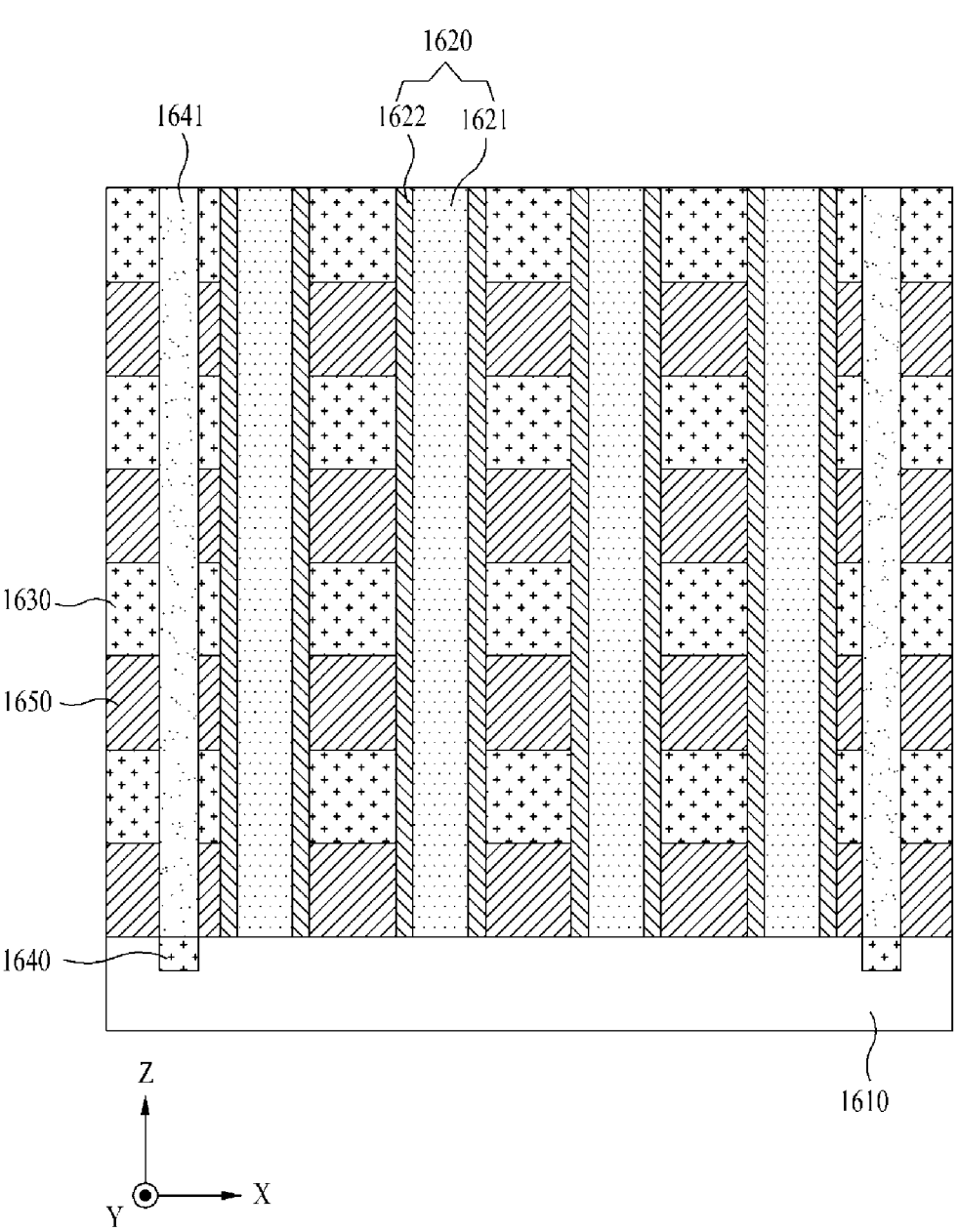
FIG. 16 is an X-Z cross-sectional view showing a three-dimensional flash memory according to one embodiment.
Figure 17:
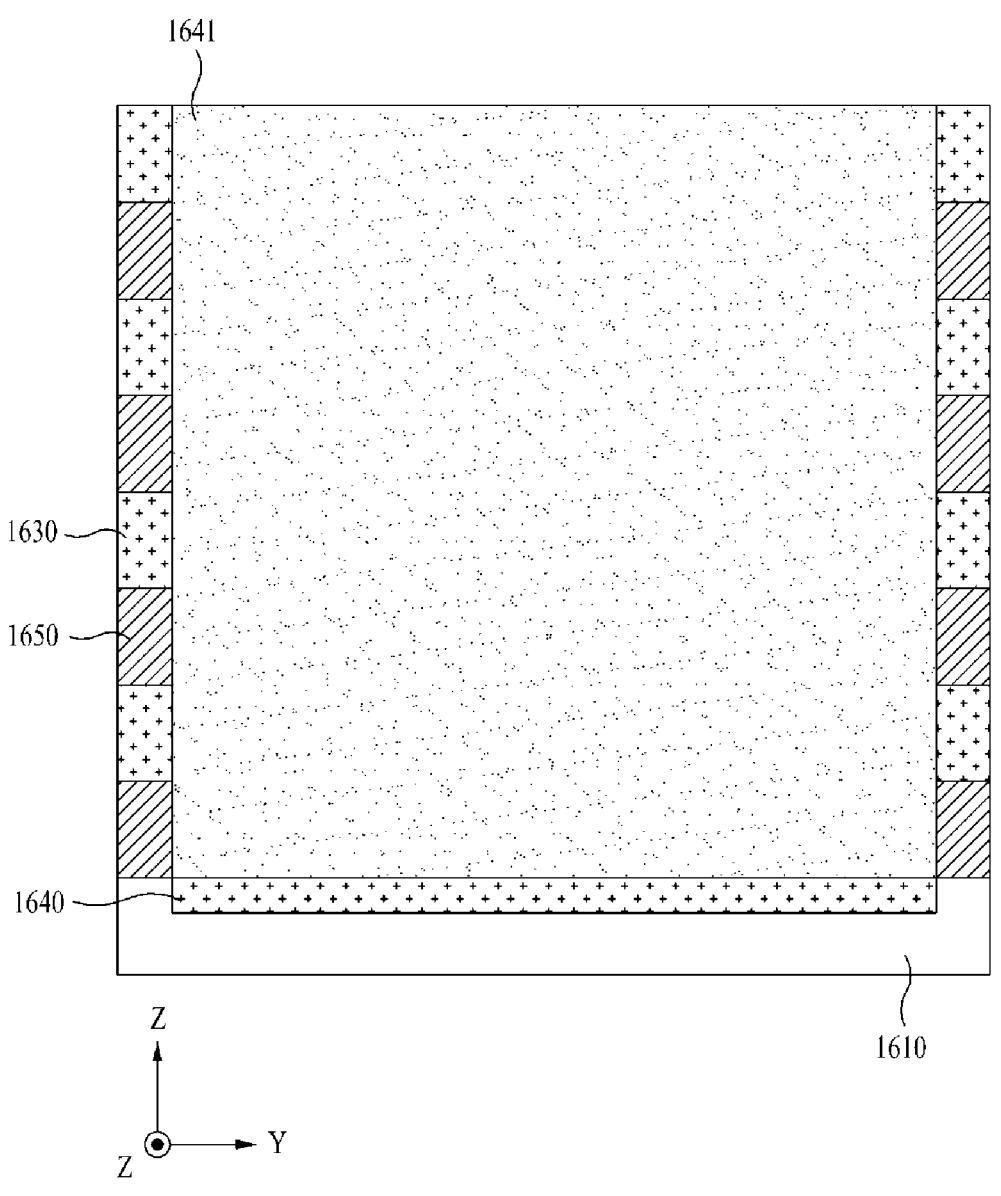
FIG. 17 is a Y-Z cross-sectional view showing a three-dimensional flash memory according to one embodiment.

FIG. 16 is an X-Z cross-sectional view showing a three-dimensional flash memory according to one embodiment, and FIG. 17 is a Y-Z cross-sectional view showing a three-dimensional flash memory according to one embodiment.

Referring to FIGS. 16 to 17, a three-dimensional flash memory 1600 according to one embodiment includes a substrate 1610, at least one memory cell string 1620, a plurality of word-lines 1630, and at least one buried source line 1640.

The substrate 1610 may be made of single crystal silicon or polysilicon.

The at least one memory cell string 1620 may be formed on the substrate 1610 so as to extend in one direction (e.g., a Z direction) and may include a drain line (not shown) disposed thereon. The at least one memory cell string 1620 may include a channel layer 1621 and a charge storage layer 1622. The channel layer 1621 may be made of monocrystalline silicon or polysilicon, and the charge storage layer 1622 is a component that is formed to surround the channel layer 1621 and stores therein charges from current flowing through the plurality of word-lines 1630. In one example, the charge storage layer 1622 may be formed to have an ONO (Oxide-Nitride-Oxide) structure. Hereinafter, an example in which the charge storage layer 1622 includes only a vertical element that extends in one direction (e.g., a Z direction) perpendicular to the substrate 1610 (extends in a direction normal to the substrate 1610) is described. However, the present disclosure is not limited thereto. The charge storage layer 1622 may further include a horizontal element that extends in a parallel manner to the substrate 1610 and is in contact with the plurality of word-lines 1630.

The channel layer 1621 and the charge storage layer 1622 constitute a plurality of memory cells corresponding to the plurality of word-lines 1630 and may be referred to as a memory cell string.

Each of the plurality of word-lines 1630 may be connected to the at least one memory cell string 1620, and may extend in a direction perpendicular thereto and may be made of a conductive material such as tungsten (W), titanium (Ti), tantalum (Ta), copper (Cu), or gold (Au) and may serve as a word line. Similarly, each of a plurality of insulating layers (not shown) may be disposed between adjacent ones of the plurality of word-lines 1630 and may be connected to the at least one memory cell string 1620, and may extend in a direction perpendicular thereto. Each of the plurality of insulating layers may be made of each of various materials having insulating ability. The plurality of insulating layers and the plurality of word-lines 1630 may be stacked alternately with each other.

The at least one buried source line 1640 may be buried in the substrate 1610 and be used as a source electrode for the at least one memory cell string 1620, and may be made of a conductive material different from a material of the substrate 1610. In this regard, the at least one buried source line 1640 may be buried in an area of the substrate 1610 other than an area thereof vertically overlapping the at least one memory cell string 1620.

For example, the at least one buried source line 1640 may not be formed by doping impurities in a partial area of the substrate 1610 and thus may not serve as a source electrode. Rather, the at least one buried source line 1640 may be made of a separate conductive material (in one example, tungsten (W), titanium (Ti), tantalum (Ta), copper (Cu), or gold (Au)) different from a material constituting the substrate 1610, such as monocrystalline silicon or polysilicon. The at least one buried source line 1640 may be buried in the substrate 1610 and may extend in one horizontal direction (e.g., a Y direction).

Figure 15:
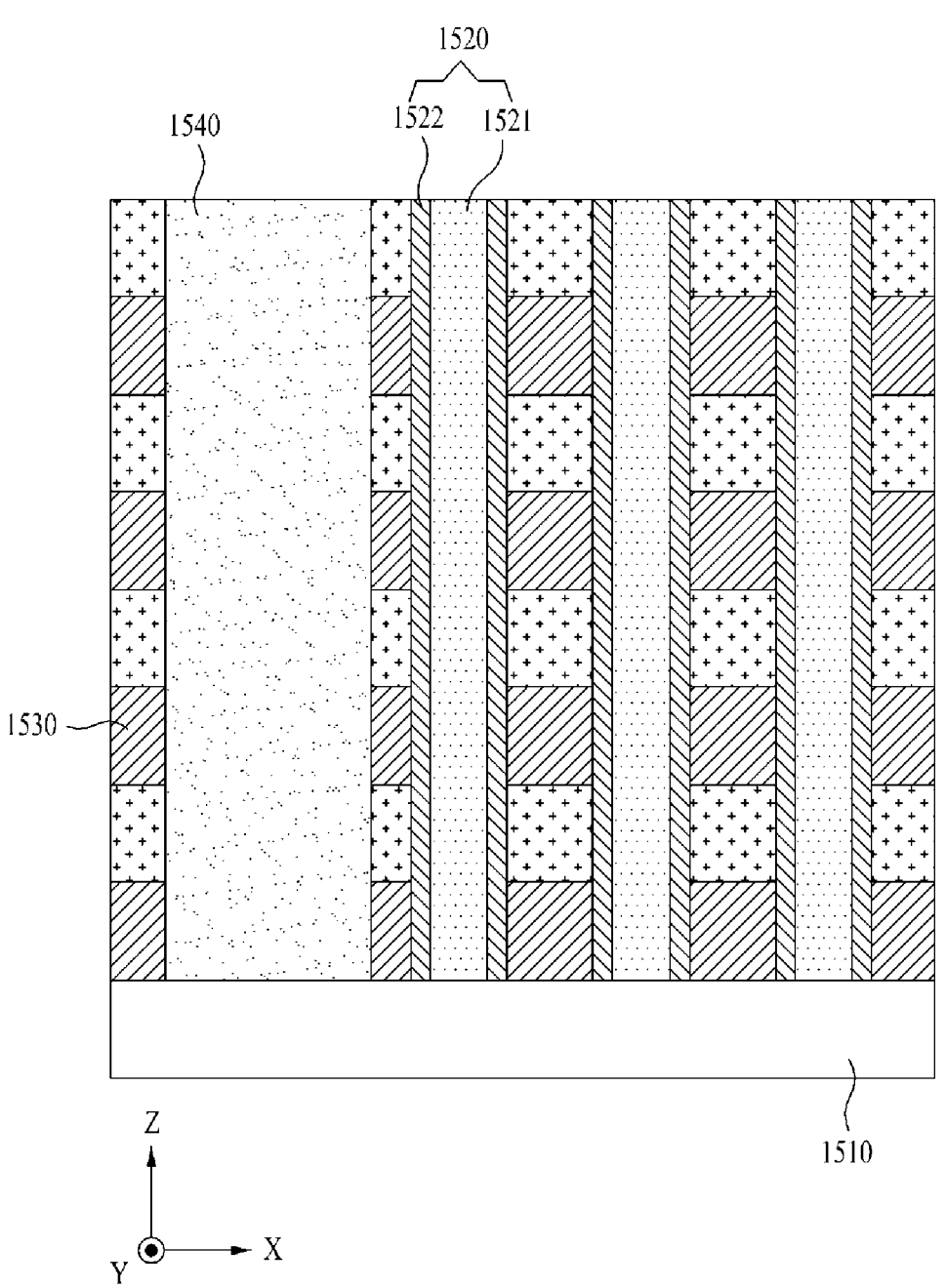
FIG. 15 is an X-Z cross-sectional view showing a conventional three-dimensional flash memory.

In this way, the at least one buried source line 1640 may be buried in the substrate 1610 while a top face of the at least one buried source line 1640 is coplanar with a top face of the substrate 1610. Complexity of the manufacturing process may be significantly lowered compared to that in a case in which the step is defined between the top face of the substrate and a side face of the source line as described with reference to FIG. 15.

Further, the at least one buried source line 1640 may have a minimized width under a condition that the at least one buried source line 1640 can be used as a common source electrode for the at least one memory cell string 1620. In one example, the at least one buried source line 1640 may have the most minimized width under a condition that current and voltage characteristics thereof that can be used as the common source electrode for the at least one memory cell string 1620 are satisfied.

Therefore, the three-dimensional flash memory 1600 according to one embodiment includes the at least one buried source line 1640 of a significantly smaller width compared to a width of the conventional common source line. Thus, cell integration of the at least one memory cell string 1620 may be improved.

Further, the at least one buried source line 1640 may be connected to the at least one memory cell string 1620 via the substrate 1610. For example, the at least one buried source line 1640 may be connected to the at least one memory cell string 1620 via a wiring (not shown) buried in the substrate 1610.

Thus, in the three-dimensional flash memory 1600 according to one embodiment, an effect of simplifying a wiring layout design may be achieved, compared to a conventional three-dimensional flash memory in which a common source line is connected to a memory cell string via an external wiring disposed above a memory cell string.

In this regard, at least one slit line 1641 utilized in a process of forming the plurality of word-lines 1630 may be located above the at least one buried source line 1640. More specifically, the at least one slit line 1641 is maintained as a trench or a hole with an empty inside until the plurality of word-lines 1630 is formed. Thus, a conductive material constituting the plurality of word-lines 1630 may flow in and along the at least one slit line 1641. After the plurality of word-lines 1630 have been formed, an insulating film may fill the at least one slit line 1641.

A method for manufacturing the three-dimensional flash memory 1600 including the at least one buried source line 1640 having such a structure will be described below.

FIG. 18 is a flowchart showing a method for manufacturing a three-dimensional flash memory according to one embodiment. FIGS. 19A to 19D are X-Z cross-sectional views illustrating a method for manufacturing a three-dimensional flash memory according to one embodiment. Hereinafter, the method for manufacturing the three-dimensional flash memory as described with reference to FIGS. 18 and 19A to 19D is applied for manufacturing the three-dimensional flash memory 1600 as described with reference to FIGS. 16 to 17. It is assumed that the method is performed by an automated and mechanized manufacturing system.

18

Figure 19A:
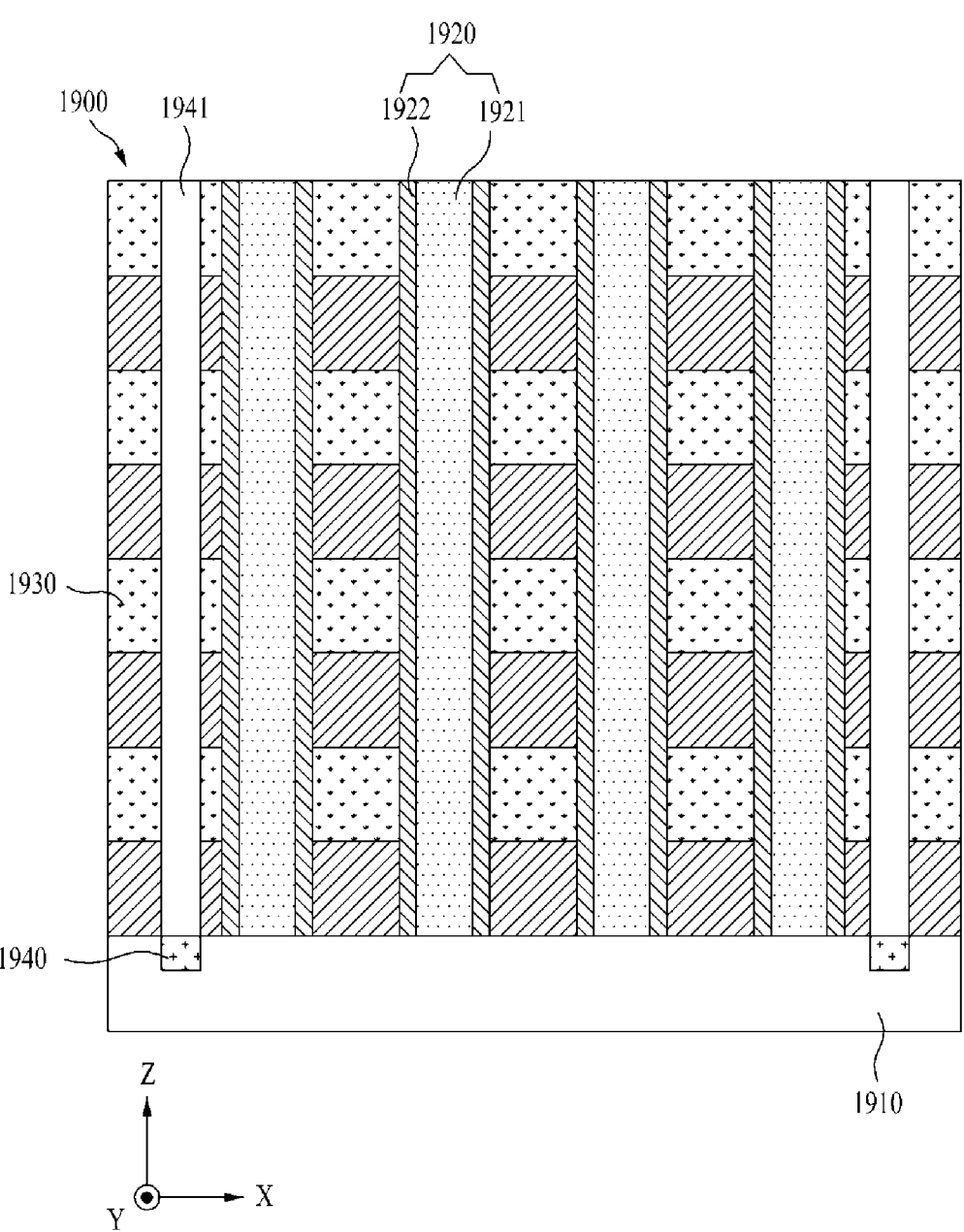
FIGS. 19A to 19D are X-Z cross-sectional views illustrating a method for manufacturing a three-dimensional flash memory according to one embodiment.

Referring to FIGS. 18 and 19A to 19D, in Step S1810, the manufacturing system prepares a semiconductor structure 1900 as shown in FIG. 19A. In this regard, the semiconductor structure 1900 includes at least one memory cell string 1920 disposed on a substrate 1910 and extending in one direction and including a channel layer 1921 and a charge storage layer 1922, a plurality of sacrificial layers 1930 stacked vertically and connected to the at least one memory cell string 1920 and extending in a direction perpendicular to the at least one memory cell string 1920, and at least one buried source line 1940 buried in the substrate 1910.

In preparing the semiconductor structure 1900, the manufacturing system may form the at least one buried source line 1940 buried in the substrate 1910 using a conductive material distinct from a material of the substrate 1910, and may connect the at least one memory cell string 1920 and the at least one buried source line 1940 to each other via the substrate 1910 (more precisely, a wiring (not shown) buried in the substrate 1910).

In this regard, in forming the at least one buried source line 1940, the manufacturing system may form the at least one buried source line 1940 buried in the substrate 1910 so that the at least one buried source line 1940 has a minimized width sized to satisfy a condition that the at least one buried source line 1940 can be used as a common source electrode for the at least one memory cell string 1920.

Figure 19B:
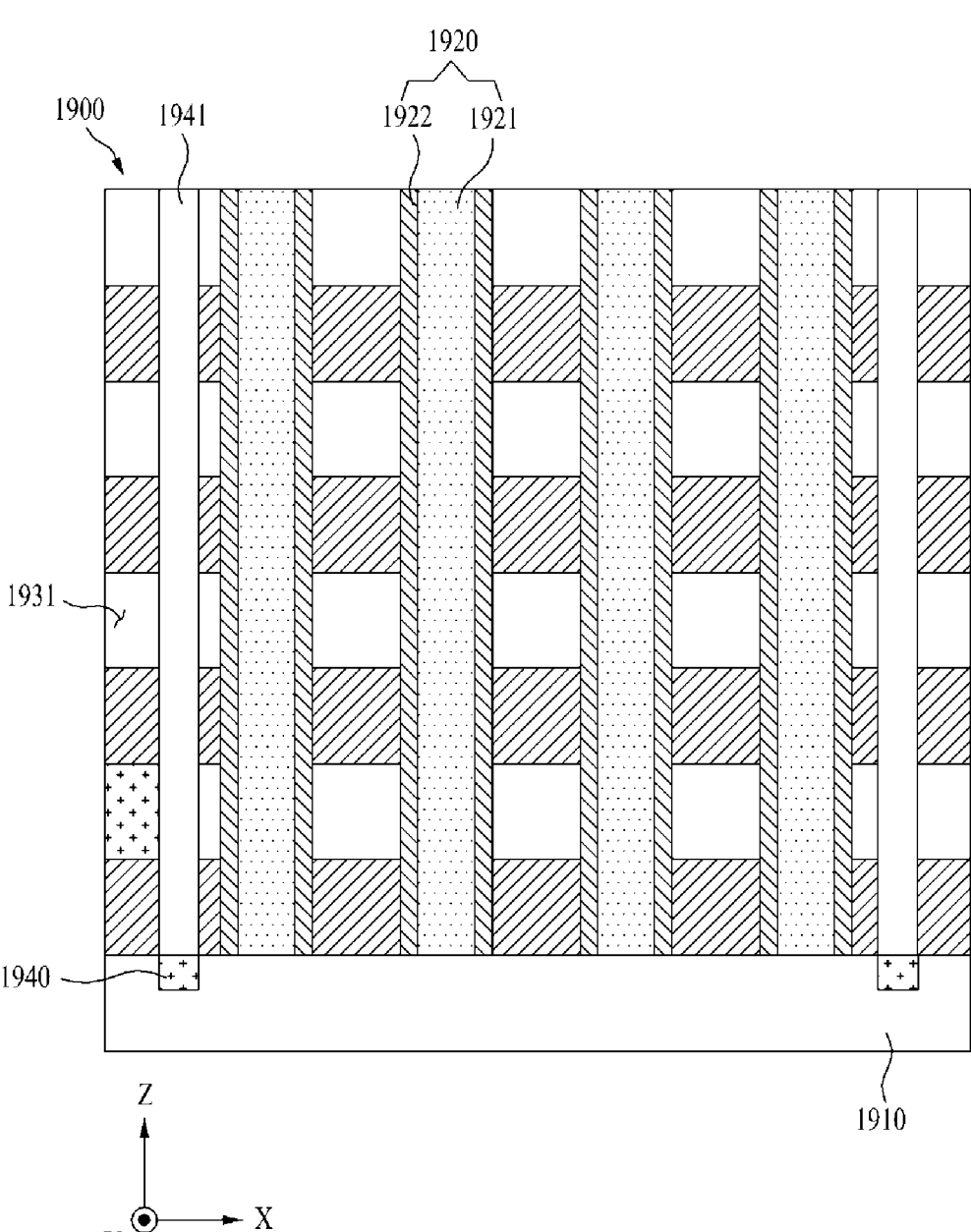

Subsequently, in Step S1820, the manufacturing system removes the plurality of sacrificial layers 1930 through at least one slit line 1941 located on the at least one buried source line 1940 from the semiconductor structure 1900, as shown in FIG. 19B. In this regard, the at least one slit line 1941 may be embodied as a trench or hole with an empty inner space so as to be used as a channel along and in which a material flows in Step S1830 described later.

In the drawing, it is shown that the at least one slit line 1941 has been already formed in the semiconductor structure 1900 in a process of preparing the semiconductor structure 1900. However, the present disclosure is not limited thereto. The semiconductor structure 1900 in which the at least one slit line 1941 is not formed may be prepared in Step S1810, and then, in a separate step (not shown) after Step S1810, the at least one slit line 1941 may be formed on the at least one buried source line 1940 of the semiconductor structure 1900.

Figure 19C:
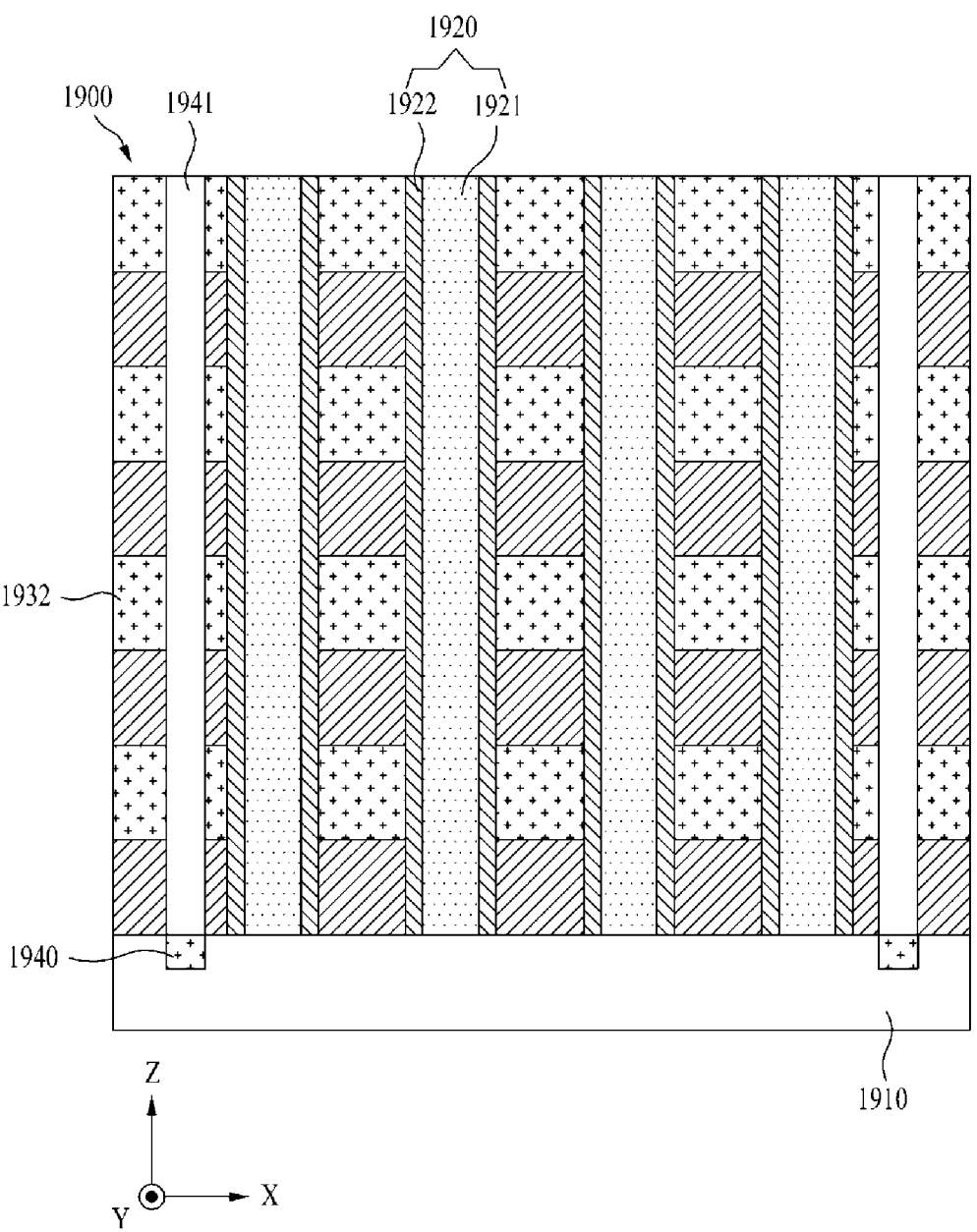

Next, in Step S1830, the manufacturing system forms the plurality of word-lines 1932 in a space 1931 obtained by removing the plurality of sacrificial layers 1930 using the at least one slit line 1941. In one example, the manufacturing system may insert a conductive material into the space 1931 obtained by removing the plurality of sacrificial layers 1930 through the at least one slit line 1941 as a material flow channel, as shown in FIG. 19C. Thus, the plurality of word-lines 1932 may be formed.

Figure 19D:
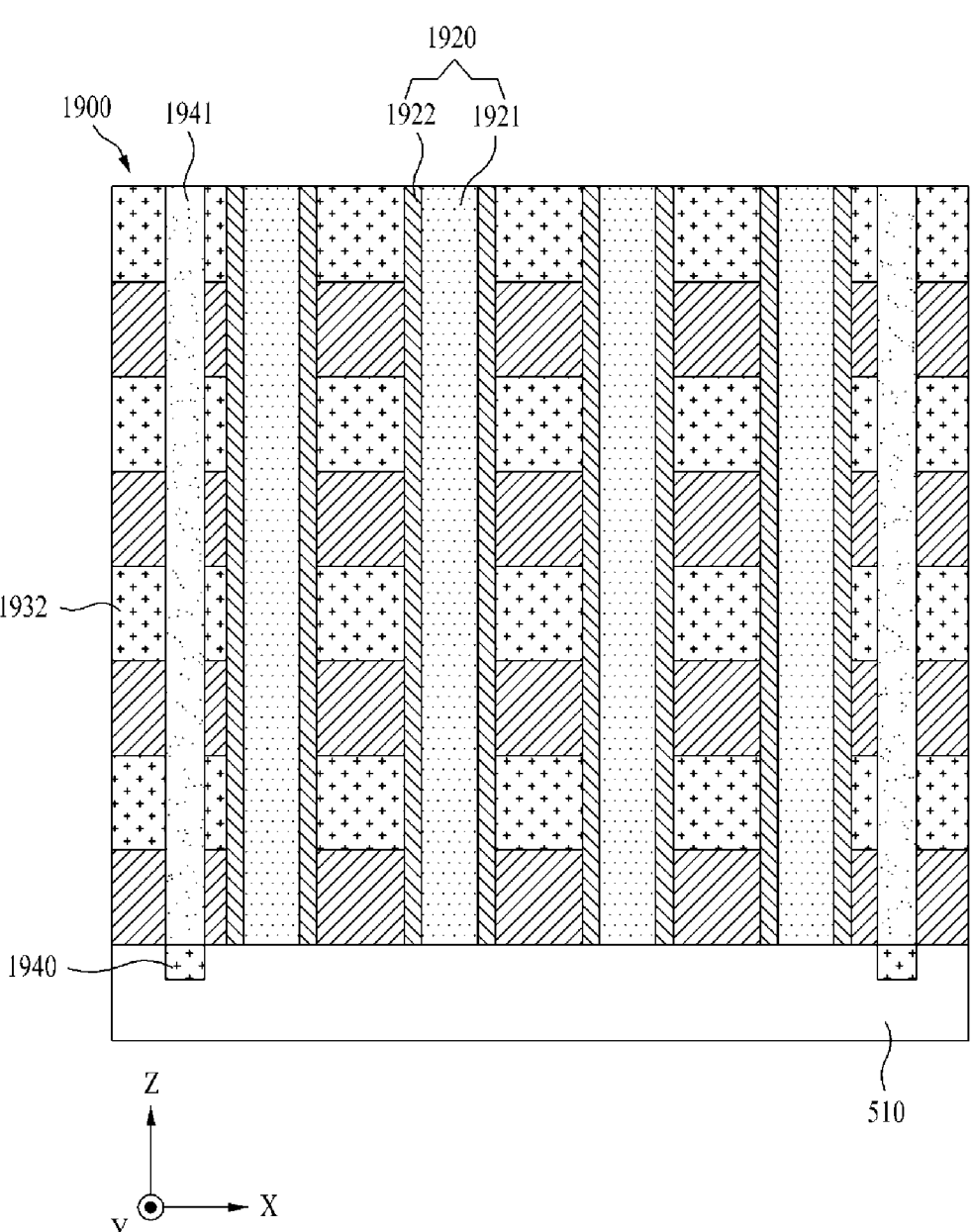

Thereafter, in a separate step as not shown in the flowchart as shown in FIG. 18, the manufacturing system may fill an insulating material into the at least one slit line 1941 after the plurality of word-lines 1932 have been formed, as shown in FIG. 19D.

An example in which the at least one buried source line 1940 and the plurality of word-lines 1932 are respectively formed through different steps (processes) has been described above. However, the at least one buried source line 1940 and the plurality of word-lines 1932 may be collectively formed through the same step (process). A detailed description thereof is provided below.

FIG. 20 is a flowchart showing a method for manufacturing a three-dimensional flash memory according to another embodiment. FIGS. 21A to 21D are X-Z cross-sectional views for illustrating a method for manufacturing a three-dimensional flash memory according to another embodiment. Hereinafter, the method for manufacturing the three-dimensional flash memory as described with reference to FIGS. 20 and 21A to 21D is used for manufacturing the three-dimensional flash memory 1600 as described with reference to FIGS. 16 to 17. It is assumed that the method is performed by an automated and mechanized manufacturing system.

Further, the method for manufacturing the three-dimensional flash memory as described with reference to FIGS. 20 and 21A to 21D differs from the method for manufacturing the three-dimensional flash memory as described with reference to FIGS. 18 and 19A to 19D in that the at least one slit line and the plurality of word-lines are collectively formed at the same process.

Figure 21A:
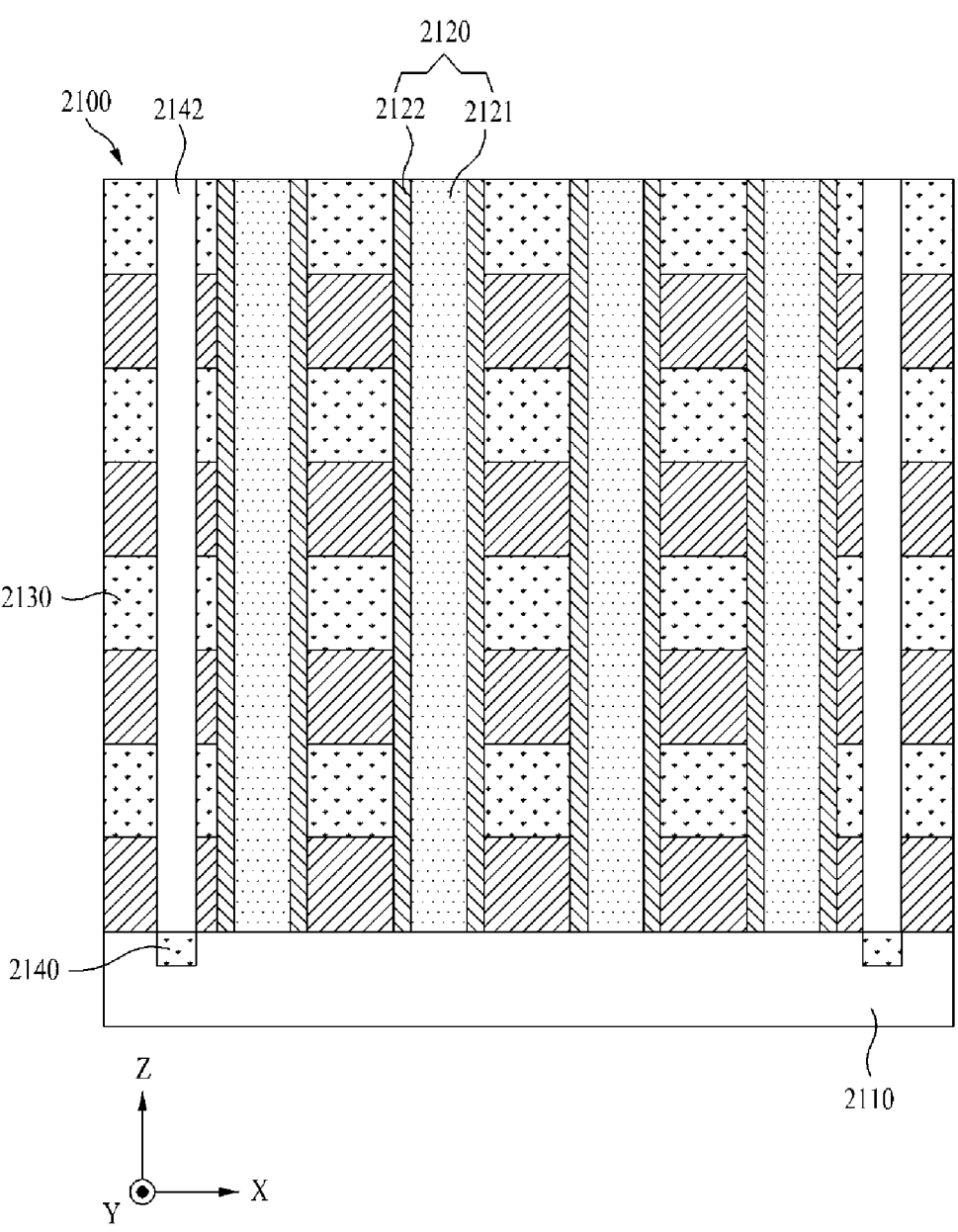
FIGS. 21A to 21D are X-Z cross-sectional views for illustrating a method for manufacturing a three-dimensional flash memory according to another embodiment.

Referring to FIGS. 20 and 21A to 21D, in Step S2010, the manufacturing system prepares a semiconductor structure 2100 as shown in FIG. 21A. In this regard, the semiconductor structure 2100 includes at least one memory cell string 2120 extending in one direction and disposed on a substrate 2110, and including a channel layer 2121 and a charge storage layer 2122, a plurality of sacrificial layers 2130 arranged vertically and connected to the at least one memory cell string 2120 and extending in a direction perpendicular thereto, and at least one buried sacrificial line 2140 buried in the substrate 2110. Hereinafter, an example in which the at least one buried sacrificial line 2140 is made of the same material as a sacrificial material of the plurality of sacrificial layers 2130 is described. However, the present disclosure is not limited thereto. The at least one buried sacrificial line 2140 may be present in a form of an empty space.

In preparing the semiconductor structure 2100, the manufacturing system may form the at least one buried sacrificial line 2140 in the substrate 2110 using the same material as that of the plurality of sacrificial layers 2130 so as to be buried in the substrate 2110. The manufacturing system may connect the at least one memory cell string 2120 and the at least one buried sacrificial line 2140 via the substrate 2110 (more precisely, a wiring (not shown) buried in the substrate 2110) such that at least one buried source line 2141 to be formed in Step S2130 as described later may be connected to the at least one memory cell string 2120.

In this regard, in forming the at least one buried sacrificial line 2140, the manufacturing system may form the at least one buried sacrificial line 2140 so as to be buried in the substrate 2110 and so as to have a minimized width sized to satisfy a condition that the at least one buried source line 2141 to be formed in Step S2030 as described later can be used as a common source electrode for the at least one memory cell string 2120.

Figure 21B:
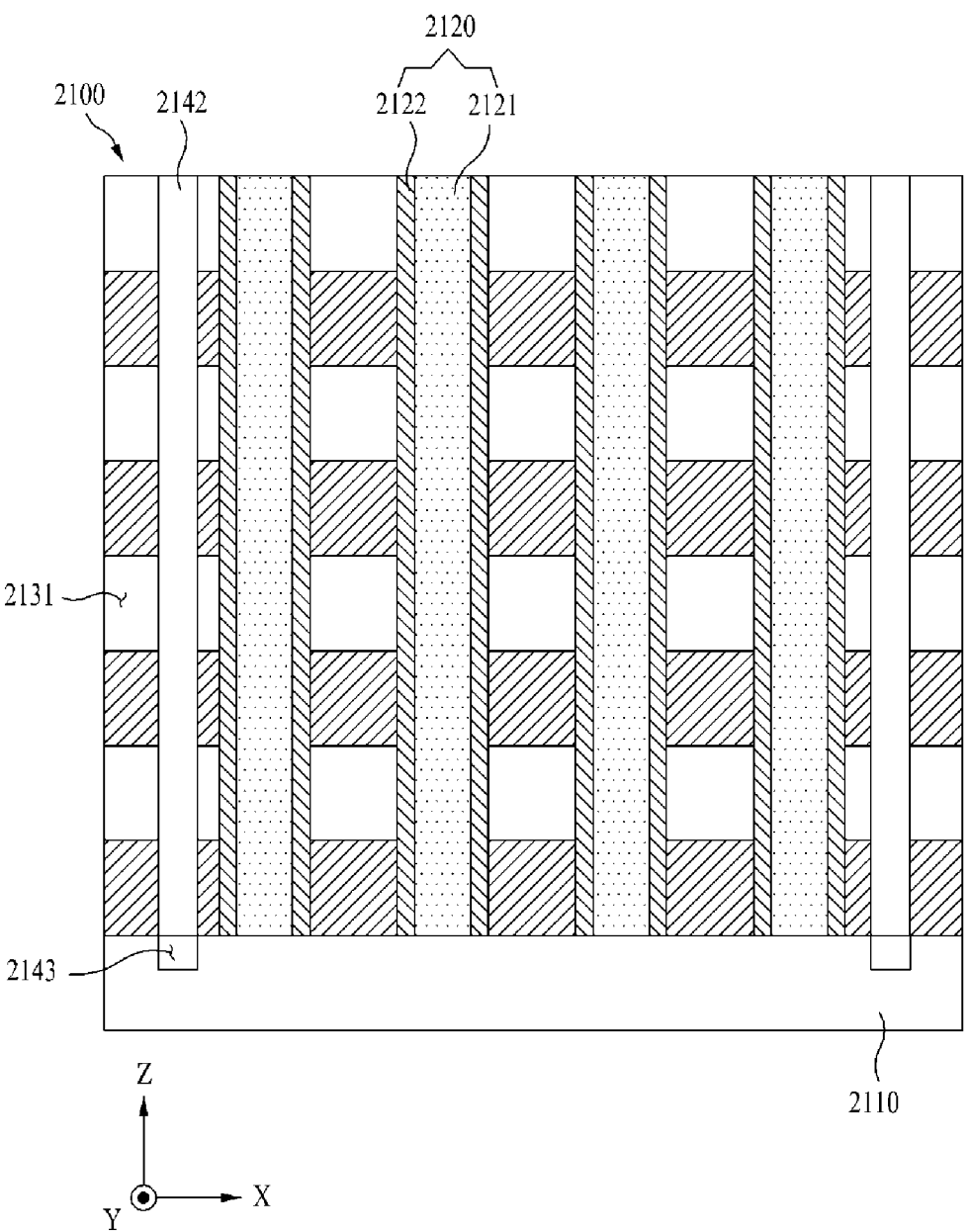

Then, in Step S2020, the manufacturing system may remove the plurality of sacrificial layers 2130 and at least one buried sacrificial line 2141 through at least one slit line 2142 located on the at least one buried sacrificial line 2140 of the semiconductor structure 2100, as shown in FIG. 21B. In this regard, the at least one slit line 2142 may have a shape of a trench or a hole with an empty inner space so as to be used as a material flow channel in Step S2030 as described below.

In the drawing, it is shown that the at least one slit line 2142 has been already formed in the semiconductor structure 2100 in a process of preparing the semiconductor structure 2100. However, the present disclosure is not limited thereto. The semiconductor structure 2100 in which the at least one slit line 2142 is not formed may be prepared in Step S2010, and then in a separate step (not shown) after Step S2020, the at least one slit line 2142 may be formed on the at least one buried sacrificial line 2140 of the semiconductor structure 2100.

Figure 21C:
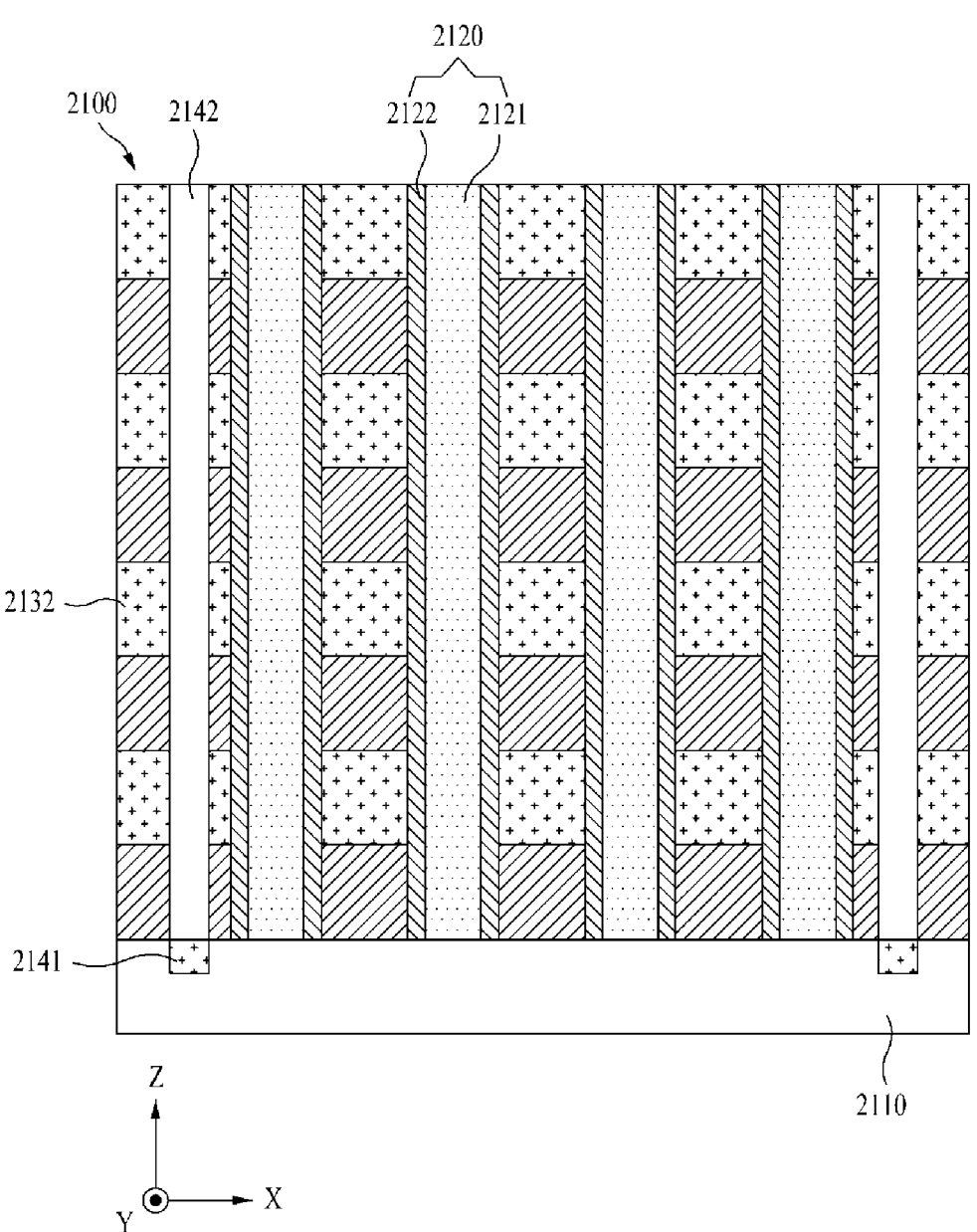

Then, in Step S2030, the manufacturing system may respectively form the plurality of word-lines 2132 and the at least one buried source line 2141 in a space 2131 obtained by removing the plurality of sacrificial layers 2130 and a space 2143 obtained by removing the at least one buried sacrificial line 2140 through the at least one slit line 2142. In one example, as shown in FIG. 21C, the manufacturing system may insert a conductive material into the space 2131 obtained by removing the plurality of sacrificial layers 2130 through the at least one slit line 2142 as a material flow channel, thereby forming the plurality of word-lines 2132, and may insert a conductive material into the space 2143 obtained by removing the at least one buried sacrificial line 2140 through the at least one slit line 2142 as a material flow channel, thereby forming the at least one buried source line 2141.

That is, in Step S2030, the manufacturing system may simultaneously and collectively form the plurality of word-lines 2132 and the at least one buried source line 2141 in a single process using the at least one slit line 2142 as the material flow channel.

Figure 21D:
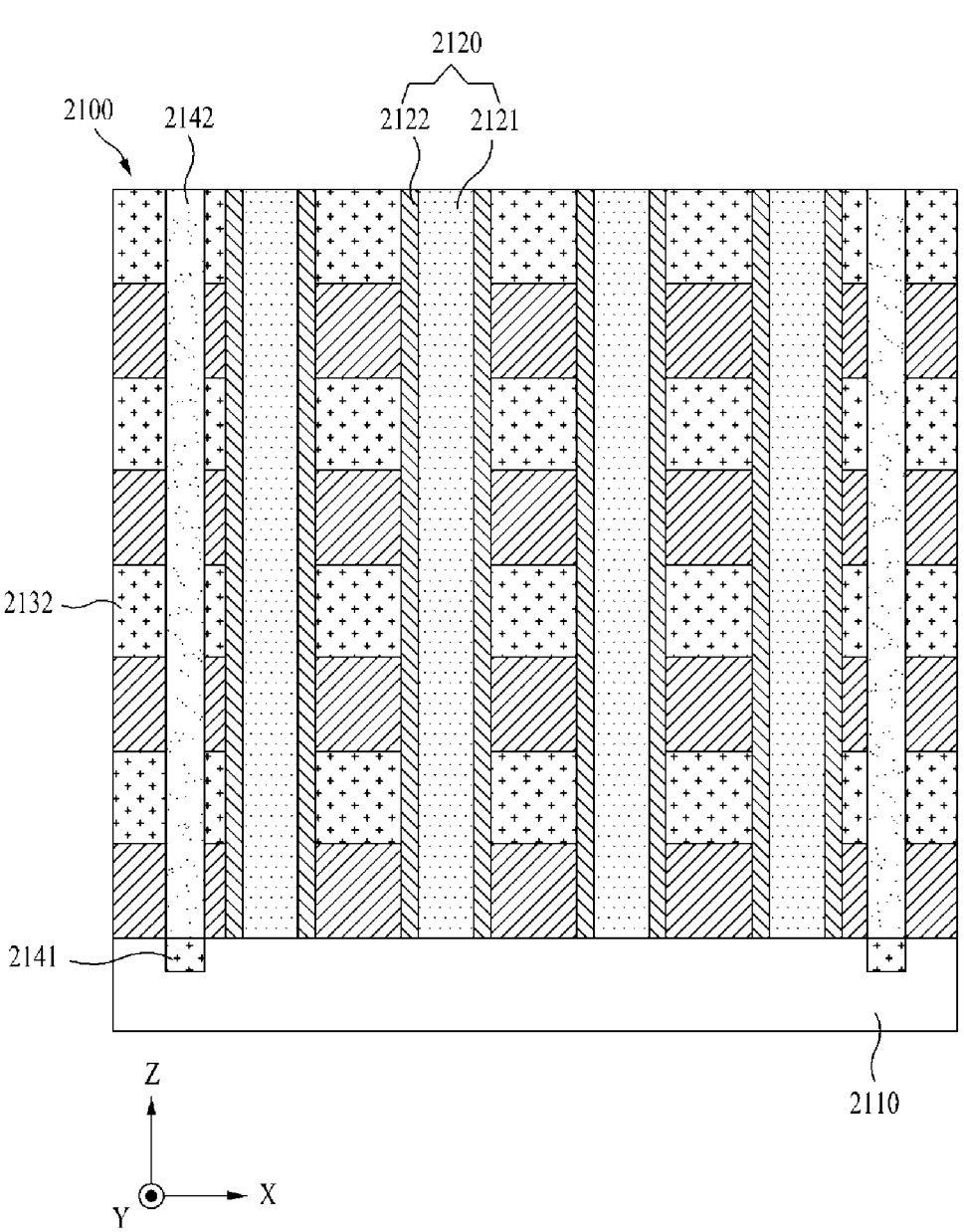

Thereafter, in a separate step not shown in the flowchart as shown in FIG. 20, the manufacturing system may fill an insulating film in the at least one slit line 2142 after the plurality of word-lines 2132 and the at least one buried source line 2141 have been formed, as shown in FIG. 21D.

In this way, the plurality of word-lines 2132 and the at least one buried source line 2141 are collectively and simultaneously formed in the single process, such that the complexity of the manufacturing process may be reduced.

Although the present disclosure is described above with limited embodiments and drawings, those skilled in the art may make various modifications and variations from the above description. For example, the described steps may be performed in a different order than the described order, and/or the components, such as systems, structures, devices, circuits, etc., as described are combined with each other in a different manner than the described manner, or may be replaced or substituted with other components, or equivalents thereto as long as appropriate results may be achieved.

Therefore, other implementations, other embodiments, and equivalents to the claims fall within the scope of the following claims.

The invention claimed is:

1. A TSV (Through Silicon Via)-based three-dimensional flash memory having high integration, the three-dimensional flash memory comprising:

a plurality of memory cell string chips respectively including a plurality of memory cell strings;

wherein the plurality of memory cell string chips comprises a first memory cell string chip and a second memory cell string chip; and a peripheral circuit chip including at least one peripheral circuit, wherein the peripheral circuit chip is disposed under at least one of the first or second memory cell string chips and is connected to the at least one of the first or second memory cell string chips via at least one TSV, wherein the at least one TSV extends through at least part of the first memory cell string chip and through at least part of the second memory cell string chip.

2. The three-dimensional flash memory of claim 1, wherein the plurality of memory cell string chips is composed, respectively, only of the plurality of memory cell strings, wherein the peripheral circuit chip is composed only of the at least one peripheral circuit.

3. The three-dimensional flash memory of claim 1, wherein the peripheral circuit chip is connected to the at least one of the first or second memory cell string chips via the at least one TSV extending through the at least one of the first or second memory cell string chips.

4. The three-dimensional flash memory of claim 1, wherein the peripheral circuit chip is disposed under the at least one of the first or second memory cell string chips among the plurality of memory cell string chips and is connected to the at least one of the first or second memory cell string chips via the at least one TSV, wherein the at least one of the first or second memory cell string chips is disposed under one remaining memory cell string chip among the plurality of memory cell string chips and is connected to the at least one of the first or second remaining memory cell string chips via the at least one TSV.

5. A three-dimensional flash memory having a COP (Cell On Peripheral circuit) structure, the three-dimensional flash memory comprising:

a substrate in which at least one transistor is formed;

at least one memory cell string disposed on the substrate and extending in one direction; and at least one drain line corresponding to the at least one memory cell string, respectively, and disposed on a bottom of the at least one memory cell string, respectively, wherein the at least one drain line is respectively disposed on the bottom of the at least one memory cell string so that a distance between the at least one drain line and the at least one transistor is the smallest.

6. The three-dimensional flash memory of claim 1, wherein the at least one drain line is respectively connected to a wiring of the at least one transistor.

7. The three-dimensional flash memory of claim 6, wherein the at least one drain line is respectively disposed on the bottom of the at least one memory cell string such that the at least one drain line is respectively connected to the wiring of the at least one transistor by the smallest distance.

8. The three-dimensional flash memory of claim 6, wherein a connection portion of the at least one drain line connected to the wiring of the at least one transistor, respectively, is positioned in an area of the substrate vertically overlapping the at least one memory cell string.

9. A three-dimensional flash memory comprising:

at least one memory cell string formed on a semiconductor substrate and extending in one direction, and including a channel layer and a charge storage layer;

a plurality of word-lines arranged vertically and connected to the at least one memory cell string and extending in a direction perpendicular to the at least one memory cell string; and at least one buried source line buried in the semiconductor substrate, wherein the at least one buried source line is made of a conductive metal material different from a semiconductor material of the semiconductor substrate.

10. The three-dimensional flash memory of claim 9, wherein at least one slit line used in a process of forming the plurality of word-lines is defined on the at least one buried source line.

11. The three-dimensional flash memory of claim 10, wherein an insulating film fills the at least one slit line after the plurality of word-lines have been formed.

12. The three-dimensional flash memory of claim 9, wherein the at least one buried source line is connected via the at least one memory cell string via the semiconductor substrate.

13. The three-dimensional flash memory of claim 9, wherein the at least one buried source line has a minimized width sized to satisfy a condition that the at least one buried source line can be used as a common source electrode for the at least one memory cell string.

14. The three-dimensional flash memory of claim 9, wherein the conductive metal material comprises at least one of: tungsten (W), titanium (Ti), tantalum (Ta), copper (Cu), or gold (Au).

* * * * *